(12) United States Patent
Keehr et al.

(10) Patent No.: US 8,290,449 B2
(45) Date of Patent: Oct. 16, 2012

(54) EQUALIZATION OF THIRD-ORDER INTERMODULATION PRODUCTS IN WIDEBAND DIRECT CONVERSION RECEIVER

(75) Inventors: Edward Keehr, Pasadena, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 956 days.

(21) Appl. No.: 12/233,314

(22) Filed: Sep. 18, 2008

(65) Prior Publication Data

US 2009/0075612 A1 Mar. 19, 2009

Related U.S. Application Data

(60) Provisional application No. 60/994,190, filed on Sep. 18, 2007, provisional application No. 61/001,266, filed on Oct. 31, 2007, provisional application No. 61/124,501, filed on Apr. 17, 2008, provisional application No. 61/130,634, filed on Jun. 2, 2008.

(51) Int. Cl.
*H04B 1/04* (2006.01)

(52) U.S. Cl. .............. 455/114.1; 455/114.2; 455/226.2; 330/149

(58) Field of Classification Search .............. 455/226.1, 455/114.3, 114.2, 311, 127.1, 127.3, 295, 455/296; 330/149; 342/174
See application file for complete search history.

(56) References Cited

U.S. PATENT DOCUMENTS

| | | | | |
|---|---|---|---|---|
| 5,237,332 A * | 8/1993 | Estrick et al. | ................ | 342/174 |
| 5,507,036 A * | 4/1996 | Vagher | .......................... | 455/295 |
| 6,429,738 B1 * | 8/2002 | Kenington | ...................... | 330/52 |
| 6,438,365 B1 | 8/2002 | Balteanu | | |
| 6,584,147 B1 * | 6/2003 | Schaumont et al. | .......... | 375/220 |
| 6,625,587 B1 * | 9/2003 | Erten et al. | ....................... | 706/22 |
| 6,654,432 B1 * | 11/2003 | O'Shea et al. | ................. | 375/354 |
| 6,980,604 B2 * | 12/2005 | Kubo et al. | ..................... | 375/296 |
| 7,212,568 B2 * | 5/2007 | Gryska | ......................... | 375/232 |
| 7,242,725 B2 * | 7/2007 | Matsumoto et al. | .......... | 375/285 |
| 7,466,256 B2 * | 12/2008 | Brueske et al. | ................ | 341/143 |
| 7,602,240 B2 * | 10/2009 | Gao et al. | ......................... | 330/98 |
| 7,622,981 B2 * | 11/2009 | Zou | ................. | 327/349 |
| 7,657,241 B2 * | 2/2010 | Shah | .......................... | 455/232.1 |
| 7,898,418 B2 * | 3/2011 | Safarian et al. | ............. | 340/572.1 |
| 2003/0186664 A1 | 10/2003 | Shah | | |
| 2008/0285681 A1 * | 11/2008 | Sorrells et al. | ................ | 375/297 |
| 2010/0075624 A1 * | 3/2010 | Shanan | ...................... | 455/253.2 |

OTHER PUBLICATIONS

Written Opinion of the International Searching Authority in corresponding PCT application.
International search report in corresponding PCT application.

* cited by examiner

*Primary Examiner* — Nay A Maung
*Assistant Examiner* — Chung-Tien Yang
(74) *Attorney, Agent, or Firm* — Milstein Zhang & Wu LLC; Joseph B. Milstein

(57) ABSTRACT

A feedforward error-compensated receiver for minimizing undesired odd-order nonlinear distortion products. The receiver includes a first receiver path configured to receive an input signal. The first receiver path outputs a signal including at least one baseband (BB) frequency. At least one second receiver path is configured to receive the input signal and to provide a second receiver path output signal. The second receiver path includes at least one odd-order nonlinear distortion reference generator. The at least one odd-order nonlinear distortion reference generator and the mixer are configured to generate a synthetic odd-order nonlinear distortion signal. A combining element is configured to receive the output signal from the first path and the output signal from the second receiver path output and to combine the signals such that the odd-order nonlinear distortion signals are substantially attenuated at an output of the combining element.

48 Claims, 27 Drawing Sheets

→ Main Path Instantaneous Signal Vector
→ Alternate Path Instantaneous Signal Vector

EQUALIZATION OF THIRD-ORDER INTERMODULATION PRODUCTS IN WIDEBAND DIRECT CONVERSION RECEIVER

CROSS-REFERENCE TO RELATED APPLICATIONS

This application claims priority to and the benefit of co-pending U.S. provisional patent application Ser. No. 60/994,190, filed Sep. 18, 2007, and titled "Equalization of IM3 Products in Wideband Direct-Downconversion Receivers," co-pending U.S. provisional patent Application Ser. No. 61/001,266, filed Oct. 31, 2007, and titled "A Power-Up Procedure for Adaptively Equalized RF Receivers," co-pending U.S. provisional patent application Ser. No. 61/124,501, filed Apr. 17, 2008, and titled "Equalization of Third-Order Intermodulation Products in Wideband Direct Conversion Receivers," and co-pending U.S. provisional patent application Ser. No. 61/130,634, filed Jun. 2, 2008, and titled "Equalization of Third-Order Intermodulation Products in Wideband Direct Conversion Receivers," each of which applications is incorporated herein by reference in its entirety. This application is also related to co-pending U.S. patent application Ser. No. 11/751,363, filed May 21, 2007 and titled "Digital and Analog IM3 Product Compensation Circuits for an RF Receiver."

FIELD OF THE INVENTION

The invention relates in general to interference suppression and more particularly to minimization of interference in radio receivers caused by third-order intermodulation products.

BACKGROUND OF THE INVENTION

Self-generated interference in radio-frequency (RF) receivers is the general result of signals interacting with circuit block nonidealities in such a way that error terms arise and corrupt the desired signal intended for reception. This interference is sometimes so severe that even increasing the circuit area and power dissipation arbitrarily to reduce the nonidealities is insufficient, and costly off-chip components are required for the receiver to meet desired specifications. Often, self-generated interference manifests itself as distortion products due to circuit block nonlinearities. Self-generated interference can also arise due to I-Q mismatch, interstage coupling, or various other mechanisms.

Self-generated interference problems, such as discussed above, worsen in general as CMOS processes continue to scale smaller. Also, as supply voltages drop, less headroom is available to apply large overdrive bias voltages to devices, worsening their linearity and matching properties. Furthermore, as market pressures demand the further reduction in the number and size of off-chip components, auxiliary blocks that once facilitated receiver design, such as off-chip SAW filters, will become extinct.

There is a need for monolithic solutions to minimize self-generated interference in RF receivers.

SUMMARY OF THE INVENTION

In one aspect, the invention relates to a feedforward error-compensated receiver for minimizing undesired odd-order nonlinear distortion products includes a first receiver path having a first path input configured to receive an input signal having at least one non-baseband frequency, and at least one first path output configured to provide a first path output signal having at least one baseband (BB) frequency. The first receiver path includes at least one mixer, the at least one mixer having a first input terminal electrically coupled to a local oscillator configured to provide a local oscillator signal and having a second input terminal electrically coupled to the first path input and having a mixer output terminal electrically coupled to the at least one first path output. The mixer is configured to perform a frequency conversion, the first path output signal including an odd-order nonlinear distortion component. The feedforward error-compensated receiver for minimizing undesired odd-order nonlinear distortion products also includes at least one second receiver path having a second path input configured to receive an input signal having at least one non-baseband frequency, and a second receiver path output terminal configured to provide a second receiver path output signal. The second receiver path includes at least one odd-order nonlinear distortion reference generator having an output terminal, the second receiver path including at least one mixer, each of the at least one mixer having a first input terminal electrically coupled to a local oscillator configured to provide a local oscillator signal and having a second input terminal electrically coupled to the at least one odd-order nonlinear distortion reference generator output terminal and having a mixer output terminal electrically coupled to the at least one second path output. The at least one odd-order nonlinear distortion reference generator and the mixer configured to generate a synthetic odd-order nonlinear distortion signal as output that is substantially similar to the odd-order nonlinear distortion component that appears at the first path output terminal. The feedforward error-compensated receiver for minimizing undesired odd-order nonlinear distortion products also includes a combining element configured to receive the output signal from the first path output terminal and configured to receive the output signal from the second receiver path output terminal and configured to combine the input signals such that the odd-order nonlinear distortion signals are substantially attenuated at an output of the combining element.

In one embodiment, the non-baseband frequency is a selected one of a radio frequency (RF) and an intermediate frequency (IF).

In another embodiment, the baseband frequency includes a low intermediate band frequency.

In yet another embodiment, the combining element is configured to use adaptive coupling.

In yet another embodiment, the combining element includes at least one adaptive equalizer having first and second adaptive equalizer inputs electrically coupled respectively to one of the first path output terminal and a second receiver path output terminal, and having at least one adaptive equalizer output configured to provide an adaptive feedforward error-compensated receiver output signal, the adaptive equalizer including an adaptive filter, the adaptive equalizer configured to automatically adjust a set of adaptive filter coefficients based on a correlation estimate between the adaptive equalizer output and the second receiver path output signal so as to reduce the second receiver path output signal content in the adaptive equalizer output to minimize undesired odd-order distortion products in the adaptive feedforward error-compensated receiver output signal.

In yet another embodiment, the first path includes a baseband filter configured to attenuate high-frequency signals.

In yet another embodiment, the at least one second receiver path includes a baseband filter configured to attenuate undesired out of band frequencies.

In yet another embodiment, the undesired out of band frequencies include high-frequency odd-order distortion products.

In yet another embodiment, the feedforward error-compensated receiver further includes a low noise amplifier (LNA) disposed between the input signal and a common signal path coupled to the first path input and the second path input.

In yet another embodiment, the LNA includes a load inductor having a secondary inductor winding configured as a source-coupled transistor pair.

In yet another embodiment, the feedforward error-compensated receiver includes a component in a frequency division duplex (FDD) receiver-transmitter.

In yet another embodiment, the feedforward error-compensated receiver includes a monolithic integrated circuit.

In yet another embodiment, the monolithic integrated circuit includes a CMOS monolithic integrated circuit.

In yet another embodiment, the odd-order distortion reference generator includes an analog RF circuit.

In yet another embodiment, the feedforward error-compensated receiver includes divide-by-two circuits situated adjacent to a LO buffer.

In yet another embodiment, the odd-order nonlinear distortion reference generator is a cubic term generator.

In yet another embodiment, the cubic reference generator includes a canonical MOS squaring circuit.

In yet another embodiment, a canonical MOS squaring circuit output is electrically coupled to one of two terminals of a source-coupled transistor pair.

In yet another embodiment, the cubic reference generator further includes a dummy squaring circuit whose output is electrically coupled to another one of the two terminals of the source-coupled transistor pair.

In yet another embodiment, the cubic reference generator includes a Gilbert cell multiplier configured to perform a final multiplication.

In yet another embodiment, the adaptive equalizer is configured to perform a LMS-based adaptive equalization.

In yet another embodiment, the adaptive equalizer is configured to perform a NLMS-based adaptive equalization.

In yet another embodiment, the adaptive equalizer is configured to perform an enhanced-degree-of-freedom LMS-based or NLMS-based adaptive equalization.

In yet another embodiment, the adaptive equalizer includes a barrel shifter and the adaptive equalizer is configured to perform a log 2-quantized NLMS algorithm using the barrel shifter.

In yet another embodiment, the second path is configured to be powered "ON" following detection of a nonlinear distortion signal corrupting the first receiver path.

In yet another embodiment, the feedforward error-compensated receiver is configured to detect the nonlinear distortion signal corrupting the first receiver path using the analog RF portion of the at least one second receiver path.

In yet another embodiment, the at least one second receiver path along with the adaptive equalizer is configured to be powered fully "ON" following detection of a nonlinear distortion signal corrupting the first signal path.

In yet another embodiment, at least one second receiver path and the first path includes a DC offset correction.

In yet another embodiment, the feedforward error-compensated receiver is configured to measure the DC offset in the absence of IM3 products and wherein the feedforward error-compensated receiver is configured to subtract the DC offset.

In yet another embodiment, the at least one second receiver path is configured to be powered at least in part to correct for the DC offset in the absence of IM3 products.

In another aspect, the invention features a nonlinear distortion reference generator circuit including a squaring circuit, the squaring circuit including a canonical squaring circuit, the squaring circuit having a squaring circuit output terminal. The nonlinear distortion reference generator circuit also includes a dummy squaring circuit having at least two active device control terminals and a dummy squaring circuit output terminal, the dummy squaring circuit substantially the same as the squaring circuit, the at least two active device control terminals electrically coupled to each other. The nonlinear distortion reference generator circuit also includes a differential source-coupled transistor pair circuit having a first and second differential source-coupled transistor pair input terminals, wherein the squaring circuit output terminal is electrically coupled to the first differential source-coupled transistor pair input terminal and the dummy squaring circuit output terminal is electrically coupled to the second differential source-coupled transistor pair input terminal.

In one embodiment, the nonlinear distortion reference generator circuit includes a CMOS circuit.

In another embodiment, the nonlinear distortion reference generator circuit includes a bipolar transistor-based circuit.

In another aspect of the invention, the invention features a multi-stage nonlinear distortion reference generator circuit including two or more stages of nonlinear distortion reference generator circuits electrically coupled to each other, wherein the multi-stage nonlinear distortion reference generator circuit is configured to have at least one high-pass filtering transfer function disposed between at least two of the two or more stages of nonlinear distortion reference generator circuits.

In one embodiment, the at least one high-pass filtering transfer function comprises a frequency-dependent coupling between at least two of the two or more stages of nonlinear distortion reference generator circuits.

In another embodiment, the at least one high-pass filtering transfer function comprises AC coupling between at least two of the two or more stages of nonlinear distortion reference generator circuits.

In another aspect of the invention, the invention features a detection circuit to detect a presence of undesired odd-order nonlinear distortion including at least one receiver path having a path input configured to receive an input signal having at least one non-baseband frequency, and a receiver path output terminal configured to provide a receiver path output signal. The receiver path includes at least one odd-order nonlinear distortion reference generator has an output terminal. The receiver path includes at least one mixer, each of the at least one mixer has a first input terminal electrically coupled to a local oscillator configured to provide a local oscillator signal and a second input terminal electrically coupled to the at least one odd-order nonlinear distortion reference generator output terminal and having a mixer output terminal electrically coupled to the at least one path output. The at least one odd-order nonlinear distortion reference generator and the mixer are configured to generate a synthetic odd-order nonlinear distortion signal as output. At least one of the at least one receiver paths is electrically coupled to at least one power detector circuit, the at least one power detector circuit configured to measure a magnitude of nonlinear distortion at, at least one of the receiver path output terminals to detect a presence of undesired odd-order nonlinear distortion.

In yet another embodiment, the detection circuit includes a baseband filter configured to attenuate unwanted nonlinear distortion products.

In yet another embodiment, the detection circuit includes a monolithic integrated circuit.

In yet another embodiment, the monolithic integrated circuit includes a CMOS monolithic integrated circuit.

In yet another embodiment, the detection circuit includes a divide-by-two circuit situated adjacent to a LO buffer.

In yet another embodiment, the odd-order nonlinear distortion reference generator includes an analog RF circuit.

In yet another embodiment, the odd-order nonlinear distortion reference generator includes a cubic term generator.

In yet another embodiment, the cubic reference generator includes a canonical MOS squaring circuit.

In yet another embodiment, the detection circuit further includes a source-coupled transistor pair having a first source-coupled transistor pair input and wherein the canonical MOS squaring circuit is electrically coupled to the first source-coupled transistor pair input.

In yet another embodiment, the source-coupled transistor pair has a second source-coupled transistor pair input and the cubic reference generator further includes a dummy squaring circuit electrically coupled to second source-coupled transistor pair input.

In yet another embodiment, the cubic reference generator includes a Gilbert cell multiplier configured to perform a final multiplication.

In another aspect of the invention, the invention features a detection circuit to detect a presence of undesired odd-order nonlinear distortion including at least one receiver path having a path input configured to receive an input signal having at least one non-baseband frequency, and a receiver path output terminal configured to provide a receiver path output signal, the receiver path including at least one odd-order nonlinear distortion reference generator having an output terminal. The receiver path includes at least one mixer, each of the at least one mixer having a first input terminal electrically coupled to a local oscillator configured to provide a local oscillator signal and has a second input terminal electrically coupled to the at least one odd-order nonlinear distortion reference generator output terminal and a mixer output terminal electrically coupled to the at least one path output. The at least one odd-order nonlinear distortion reference generator and the mixer are configured to generate a synthetic odd-order nonlinear distortion signal as output. At least one of the at least one odd-order nonlinear distortion reference generator output terminals is electrically coupled to at least one power detector circuit, the at least one power detector circuit configured to measure a magnitude of nonlinear distortion at the odd-order nonlinear distortion reference generator output terminal to detect a presence of undesired odd-order nonlinear distortion. Also, at least a portion of at least one of the receiver paths is powered-down until a detection of a threshold level of the undesired odd-order nonlinear distortion is exceeded, whereupon detection of exceeding the threshold, the detection circuit causes a powering-ON of all stages of at least one receiver path to perform a cancellation of at least some undesired odd-order nonlinear distortion products.

In another aspect of the invention, the invention features a method to detect the presence of odd-order nonlinear distortion in a radio receiver including the steps of: providing a radio receiver having a first path and at least one second path, at least one of the second paths including at least at least one odd-order nonlinear distortion reference generator; measuring a level of odd-order nonlinear distortion present in the first path based on an output of one of the at least one odd-order nonlinear distortion reference generators; and comparing the measured level of odd-order nonlinear distortion to a threshold level to detect the presence of odd-order nonlinear distortion in the first path.

In another aspect of the invention, the invention features a method to detect the presence of odd-order nonlinear distortion in a radio receiver including the steps of: providing a radio receiver having a first path and at least one second path, at least one of the second paths including at least at least one odd-order nonlinear distortion reference generator; measuring a level of odd-order nonlinear distortion present in the first path based on an output of one of the second path; and comparing the measured level of odd-order nonlinear distortion to a threshold level to detect the presence of odd-order nonlinear distortion in the first path.

In another aspect of the invention, the invention features a method to remove a DC offset in a radio receiver including the steps of: providing a radio receiver having at least one signal path having at least one mixer and a local oscillator, the signal path further including at least one averaging circuit to measure a DC offset; measuring the DC offset using the averaging circuit; subtracting a measured DC offset from the signal path to remove the DC offset.

In yet another embodiment, the steps of measuring the DC offset and subtracting a measured DC offset include digital circuits.

In yet another embodiment, the step of measuring includes measuring the DC offset using the averaging circuit to generate a measured averaged DC offset value and further high pass filtering the measured averaged DC offset value.

In yet another embodiment, the step of subtracting includes subtracting and high pass filtering a measured DC offset from the signal path to remove the DC offset.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

We begin with a general introduction to receiver noise suppression, including suppression of self generated noise. An alternate path receiver solution is described that can provide equalization of third-order intermodulation products in the presence of self-generated interference. We conclude the description with exemplary prototype alternate path receiver test results.

Beginning with interference suppression, note that an error-producing signal is retained in a system at some point, while the error-generation mechanism is known, at least qualitatively. Such a scheme was described in U.S. Pat. No. 6,804,359, Signal Processor for Reducing Undesirable Signal Content, issued Oct. 12, 2004 to Yu, et al. According to Yu, error producers within the RF receiver were applied to a rough model of the error generation mechanism to generate a reference signal consisting solely of the corruptive error. However, the actual model of the error is never known precisely. This information was probably also known by Estrick. (U.S. Pat. No. 5,237,332, issued Aug. 17, 1993).

Figure 1:
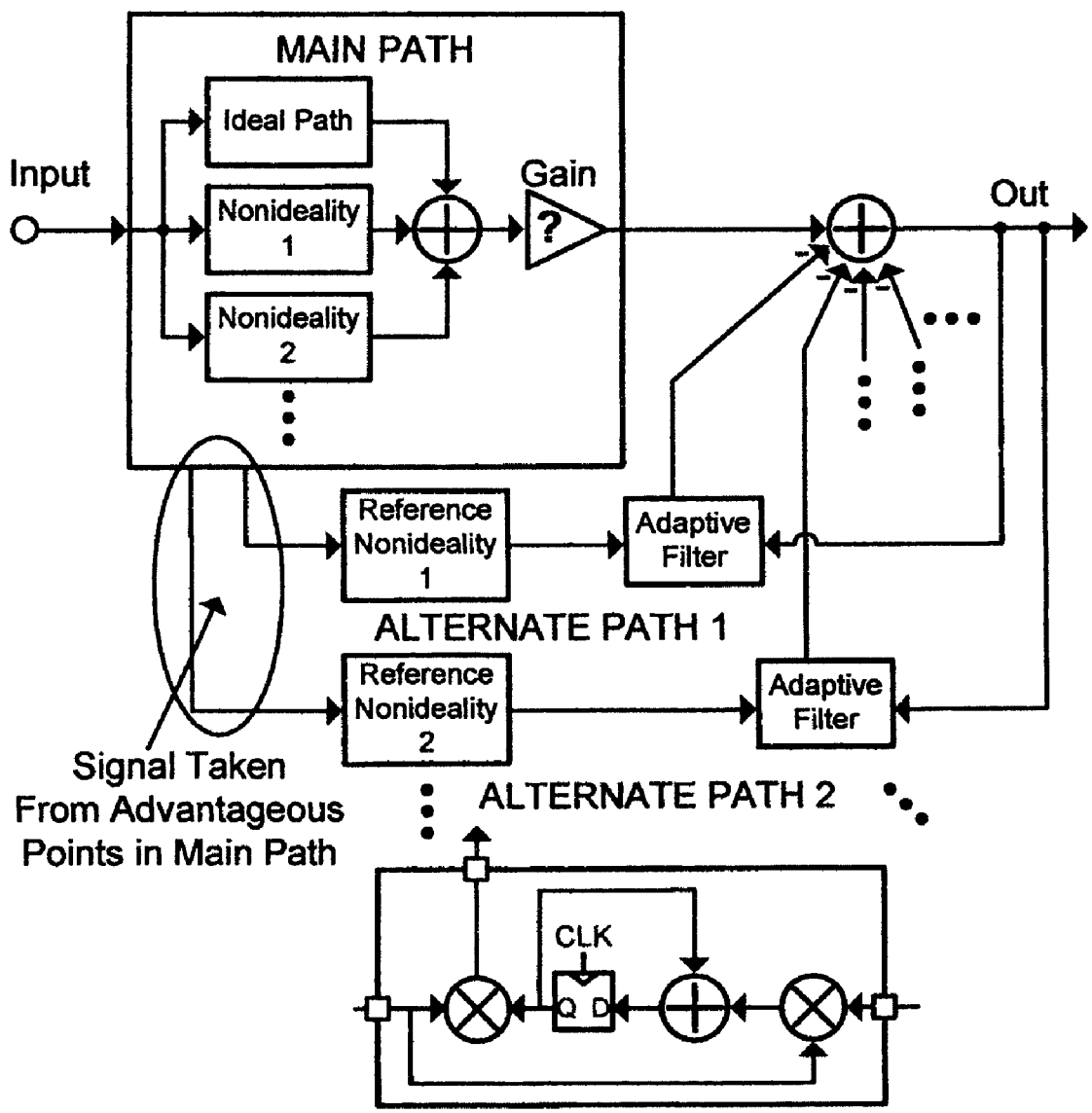
FIG. 1 shows a block diagram of a second path error cancellation technique.

FIG. 1 shows how an adaptive equalization algorithm can be employed to subtract the reference signal from the corrupted main receiver path, as it can account for minor uncertainties in the effective alternate path baseband transfer function. For simplicity in FIG. 1, only a DC gain uncertainty is shown. Such a system-level solution methodology can be advantageous for many reasons, not the least of which is its indifference towards the details of the original receiver. As this technique focuses only on cancellation of the error itself and not the error producers, it permits a relatively narrowband alternate path. That is, although large, undesired, error-producing signals may occur over a wide frequency range, the relevant error terms that they produce are typically restricted to a much smaller bandwidth equal to that of the desired signal. The circuits processing the error can operate with a lower dynamic range than their original receiver counterparts, as the corruptive error to noise ratio is in general much less than the error producer to noise ratio in the main path. If a least means square (LMS) algorithm is used to perform the adaptive equalization, multiple LMS loops in parallel can be used to cancel different interference signals as shown in FIG. 1. For example, as implemented by M. Faulkner, in "DC Offset and IM2 Removal in Direct Conversion Receivers" (IEE Proceedings Communications, vol. 149, pp. 179-184, June, 2002), IM2 products and DC offset are corrected by independent LMS loops. Finally, in the event that the self-generated interference of interest is due to large undesired blocker signals, the power dissipation of an alternate path can be further reduced by powering the alternate path "ON" only when needed, as most receivers only need to operate in the presence of strong interferers for relatively short periods of time.

There is presently a continued and rising popularity of frequency division duplex (FDD) standards for 3G wireless communications. Of related interest is the task of improving the linearity of RF receiver front ends. As noted by Faulkner, Estrick and Siddoway in U.S. Pat. No. 5,237,332, issued Aug. 17, 1993, and by Valkama, et al. in "Advanced Digital Signal Processing Techniques for Compensation of Nonlinear Distortion in Wideband Multicarrier Radio Receivers" (IEEE Trans. Microwave Theory and Techniques, vol. 54, pp. 2356-2366, June 2006), adaptive feedforward error cancellation can be used to deal with the problem of improving the third-order linearity of RF receiver front ends. However, the current literature only contains at most descriptions of high-level system studies implemented with discrete RF components.

One exemplary commercial application includes a radio "front end" implemented for the UMTS Region 1 standard. Of particular interest is to compensate for the exacting linearity requirements implicitly imposed by the FDD out-of-band blocker test as described by the 3GPP Technical Specification Group in 3GPP in UE Radio Transmission and Reception (FDD), (TSG) RAN WG4, TS 25.101, v8.1.0, December 2007. In order to meet these specifications, at least three prior art commercial receivers have used interstage SAW filters to attenuate large blocker signals. The use of SAW filters relaxes requirements on the integrated circuit blocks. SAW-less UMTS receivers have been reported by Tamura, et al. in "A Low Voltage (1.8V) Operation Triple Band WCDMA Transceiver IC" (IEEE RFIC Symposium, pp. 269-272, June 2005), Yanduru, et al. in "A WCDMA, GSM/GPRS/EDGE Receiver Front End without Interstage SAW Filter" (IEEE RFIC Symposium, June 2006), and by Tenbroek, et al. in "Single-Chip Tri-Band WCDMA/HSDPA Transceiver without External SAW Filters and with Integrated TX Power Control" (IEEE International Solid-State Circuits Conference (ISSCC) Dig. Tech. Papers, pp. 202-203, February 2008). These prior art receivers all exhibit a somewhat lower out of band IIP3 performance. Also, reported IIP3 specifications and achievements vary widely within the literature as shown in the table which follows:

REPORTED IIP3 SPECIFICATION AND
PERFORMANCE COMPARISON

| Reference | IIP3 Specification | IIP3 Performance |
| --- | --- | --- |
| Reynolds, et al., 2005 | +1.3 dBm | +1.6 dBm |
| Kaczman, et. al., 2006 | −6.1 dBm | −0.5 dBm |
| Tamura, et al., 2005 | −10 dBm | −7.4 dBm |
| Yanduru, et. al., 2006 | −8 dBm | −7 dBm |
| Tenbroek, et. al., 2008 | −5 dBm | −2 dBm |

These variations are due, at least in part, to the fact that the IIP3 specification depends on the receiver achieved noise figure, the peak TX power to be handled, and the characteristics of the particular duplexer used. Although the SAW-less receivers mentioned above meet their respective self-imposed out-of-band IIP3 specifications, it is worthwhile to consider the design of SAW-less receivers with still higher IIP3, in order to permit the use of less stringent, and possibly also less expensive duplexer blocks.

Figures 2A, 2B:
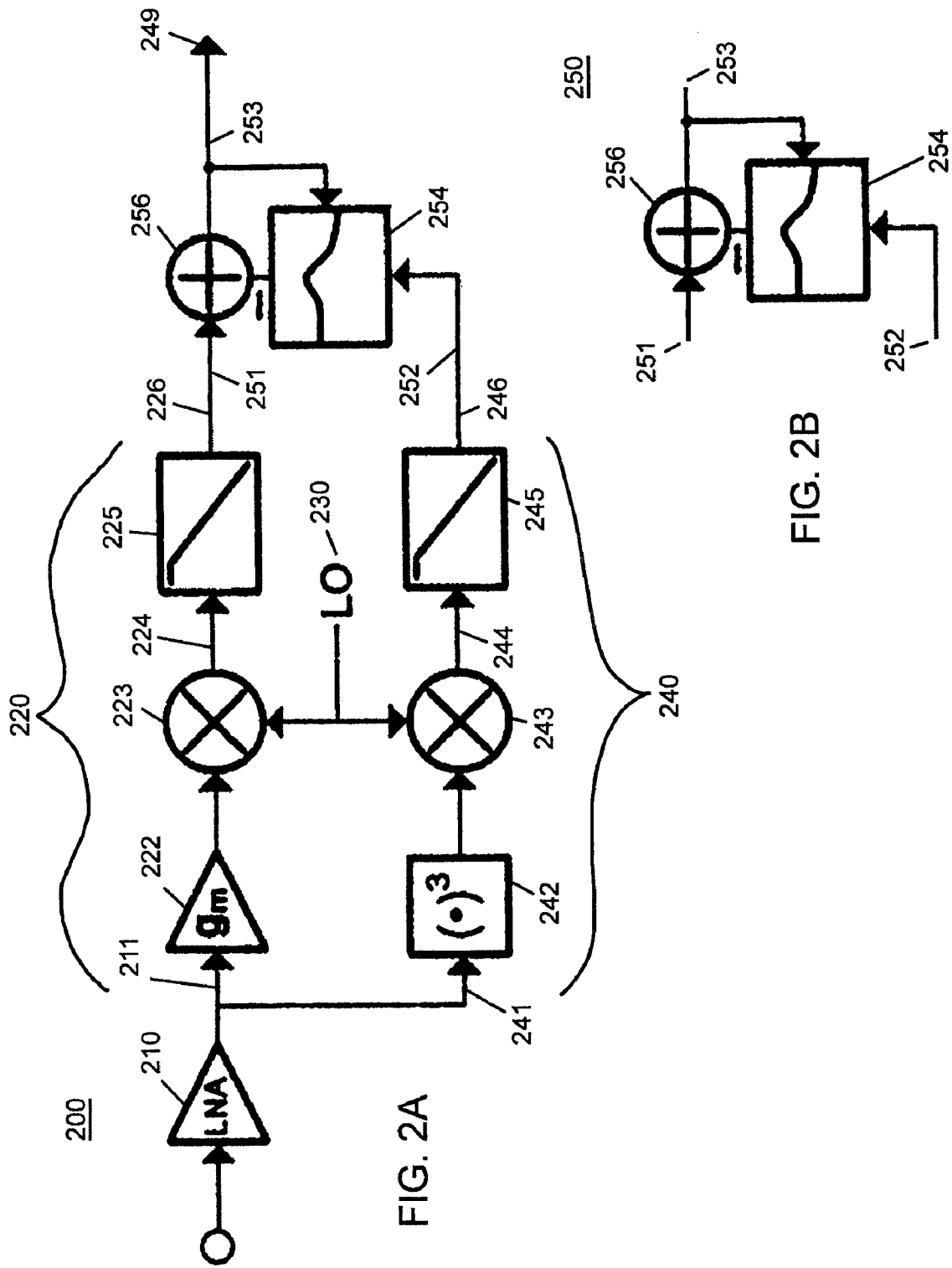
FIG. 2A shows a block diagram of one embodiment of an exemplary alternate path receiver according to the invention.
FIG. 2B shows a block diagram of an adaptive equalizer suitable for use in the alternate path receiver of FIG. 2A.

FIG. 2A shows a block diagram of one embodiment of the inventive adaptive feedforward IM3 cancellation scheme. An alternate path receiver 200 for minimizing undesired third order intermodulation products includes a low noise amplifier (LNA) 210 configured to receive an electromagnetic signal at a receiver input 211. A first receiver path, such as main receiver path 220, has a main path input 211 and a main path output 226. Main receiver path 220 includes an amplifier 222 electrically coupled to LNA 210 (the input to amplifier 222 can serve as main path input 211), a mixer 223 electrically coupled to amplifier 222 and a local oscillator (LO) 230. Mixer 223 also has a main mixer output 224. A baseband amplifier 225 is electrically coupled to main mixer output 224. Baseband amplifier 225 typically includes a filter function (generally a low pass filter) in addition to providing gain. Main receiver path 220 has a main path output 226 at the output of baseband amplifier 225. The main path output signal at main path output 226 includes undesired third order intermodulation products.

Continuing with FIG. 2A, a second receiver path, such as an alternate receiver path 240 has an alternate path output 246. Note that as described in more detail below, with regard to FIG. 2C, there can be a plurality of alternate paths from a second path to N paths. Alternate path 240 has an alternate path input 241. Alternate path 240 includes a cubic reference generator 242 coupled to LNA 210 and configured to provide a cubic reference signal (the input to cubic reference generator 242 can serve as alternate path input 241). The alternate path mixer 243 is electrically coupled to the cubic reference generator 242 and LO 230. Alternate path mixer 243 also has an alternate path mixer output 244. Alternate path amplifier 245 is electrically coupled to alternate path mixer output 244. Alternate path amplifier 245 typically includes a filter function (generally a low pass filter) in addition to providing gain. The alternate path 240 is configured to provide a baseband reference signal at alternate path amplifier output 246.

Turning to FIG. 2B, an adaptive equalizer 250 has a first adaptive equalizer input 251 and second adaptive equalizer input 252. First adaptive equalizer input 251 is electrically coupled main path output 226. Second adaptive equalizer input 252 is electrically coupled alternate path output 246. The output 253 of adaptive equalizer 250 is configured to provide an alternate path receiver output signal at alternate path receiver output (FIG. 2A, 249). Adaptive equalizer 250 includes an adaptive filter 254. Summer 256 subtracts the output of adaptive filter 254 from the signal at the first adaptive equalizer input 251. Considering now both FIG. 2A and FIG. 2B, adaptive equalizer 250 is configured to automatically adjust a set of adaptive filter coefficients based on a correlation estimate between the adaptive equalizer output 253 and the baseband reference signal at alternate path output 246 so as to reduce the baseband reference signal content in adaptive equalizer output 253 to minimize undesired third order intermodulation products in the alternate path receiver output signal at alternate path receiver output 249.

Figure 2C:
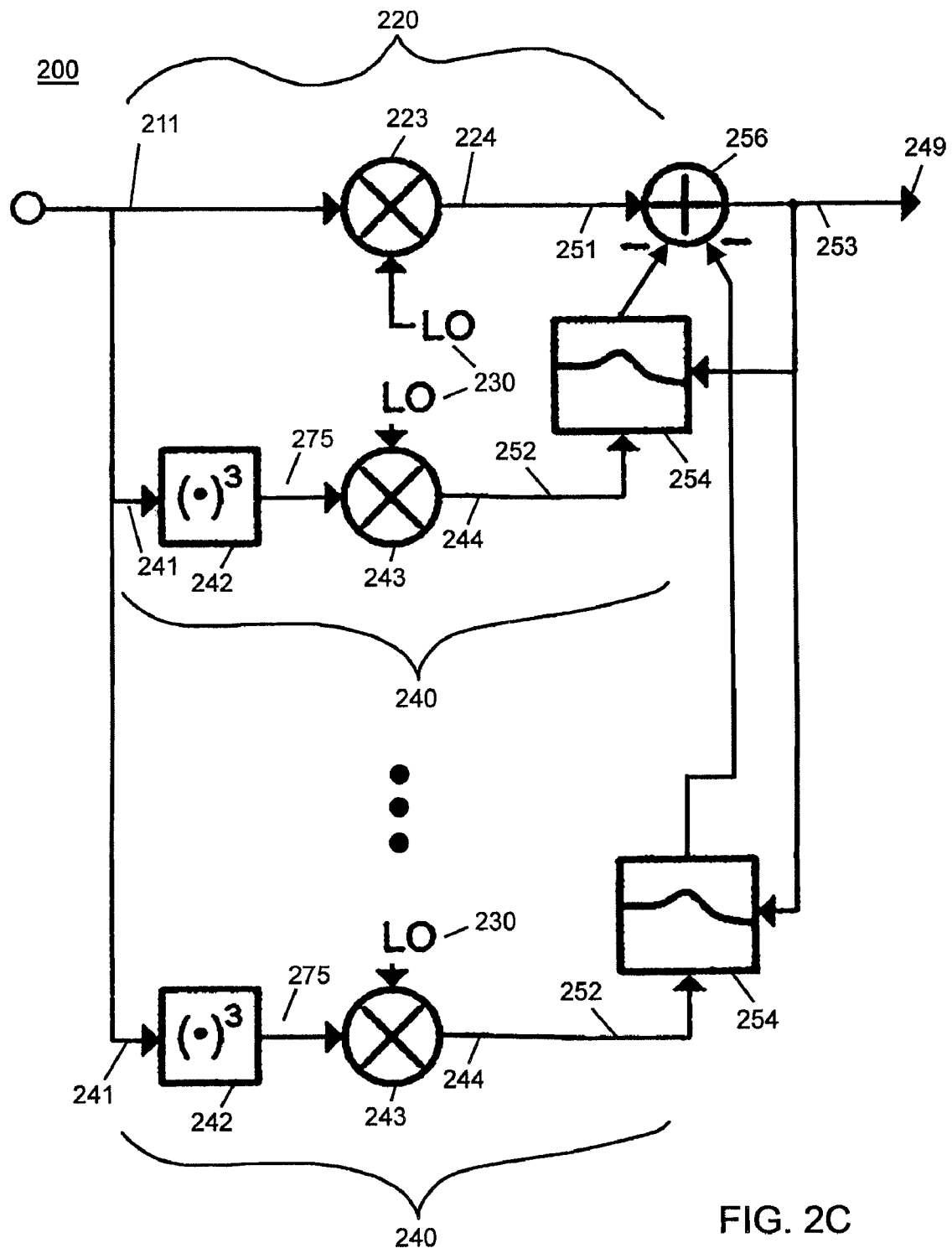
FIG. 2C shows a block diagram of another embodiment of an exemplary alternate path receiver according to the invention.

Turning now to FIG. 2C we describe another more general embodiment of an alternate path receiver 200. As above, in this feedforward error-compensated receiver, there is a main 220 and one or more alternate paths 240. A first path, such as a main receiver path 220, has a main path input 211 configured to receive an input signal including at least one non-baseband frequency, and at least one main path output, here shown as mixer output 224 (similar to the main path output at baseband amplifier 225 in FIG. 2A) configured to provide as output a signal including at least one baseband (BB) frequency. The main receiver path 220 includes at least one mixer 223. The at least one mixer 223 has a first input terminal electrically coupled to a local oscillator 230 signal and a second input terminal electrically coupled to the main path input 211. A mixer output terminal 224 is electrically coupled to the at least one main path output. The mixer 223 is configured to perform a frequency conversion. The output signal from the main path output terminal 224 includes an odd-order nonlinear distortion component.

Continuing with FIG. 2C, there can be from one second path to N additional paths, such as one or more alternate receiver paths 240 each of which has an alternate path input 241 configured to receive the input signal having at least one non-baseband frequency. The N alternate paths can typically be substantially similar in structure, with each path configured to provide a different odd-order nonlinear signal (for example, one path configured to provide a third-order nonlinear signal, another path configured to provide a fifth-order nonlinear signal, still another path configured to provide a seventh-order nonlinear signal, and so forth). The alternate receiver path output terminal 244 (similar to 246 in FIG. 2A) is configured to provide an alternate receiver path output signal. The alternate receiver path 240 includes at least one odd-order nonlinear distortion reference generator 242 having an output terminal 275. In the embodiment of FIG. 2C, the alternative receiver path 240 includes at least one mixer 243. Each of the at least one mixers 243 have a first input terminal electrically coupled to a local oscillator 230 signal and a second input terminal electrically coupled to the at least one odd-order nonlinear distortion reference generator 242 output terminal. A mixer 243 output terminal is electrically coupled to the at least one alternative path output 244. The at least one odd-order nonlinear distortion reference generator 242 and mixer 243 are configured to generate a synthetic odd-order nonlinear distortion signal as output at the a second receiver path output terminal 244 that is substantially similar to an odd order nonlinear distortion component that appears at the main path output terminal 224. A combining element, such as summer 256, is configured to receive the output signal from the main path output terminal 224 and to receive the output signal from the a second receiver path output terminals 244 and configured to combine these input signals such that the odd-order nonlinear distortion signals are substantially attenuated at an output 249 of the combining element.

The input signal source to an alternate path receiver 200 can be at a radio frequency (RF), such as an over-the-air transmission, or at an intermediate frequency (IF) as typically output from a receiver first mixer. Also, the baseband frequency signals can include frequencies in a low intermediate frequency band. As seen in the exemplary embodiments of FIG. 2A and FIG. 2C, the combining section or element can be configured to use adaptive coupling. For example, a combining element can include one or more adaptive equalizers. As seen in FIG. 2A, embodiments such as shown in FIG. 2B can further include a baseband filter in the main path to attenuate high frequency signals. Also, the alternate path can further include a baseband filter to attenuate undesired out of band frequencies. Such undesired out of band frequencies can include high-frequency odd-order distortion products. Also, as seen in FIG. 2A, embodiments such as shown in FIG. 2B can further include a low noise amplifier (LNA) disposed between the input signal and a common signal path coupled to both the main path input and the alternate path input. Such an LNA can include a load inductor having a secondary inductor winding configured as a source-coupled transistor pair.

Also, two or more stages of nonlinear distortion reference generator circuits can be combined to make a multi-stage nonlinear distortion reference generator. A multi-stage nonlinear distortion reference generator circuit can be configured to have at least one high-pass filtering transfer function disposed between at least two of the two or more stages of nonlinear distortion reference generator circuits. The filtering transfer function can be a frequency-dependent coupling between at least two of the two or more stages of nonlinear distortion reference generator circuits and can include AC coupling between at least two of the two or more stages of nonlinear distortion reference generator circuits.

Figure 2D:
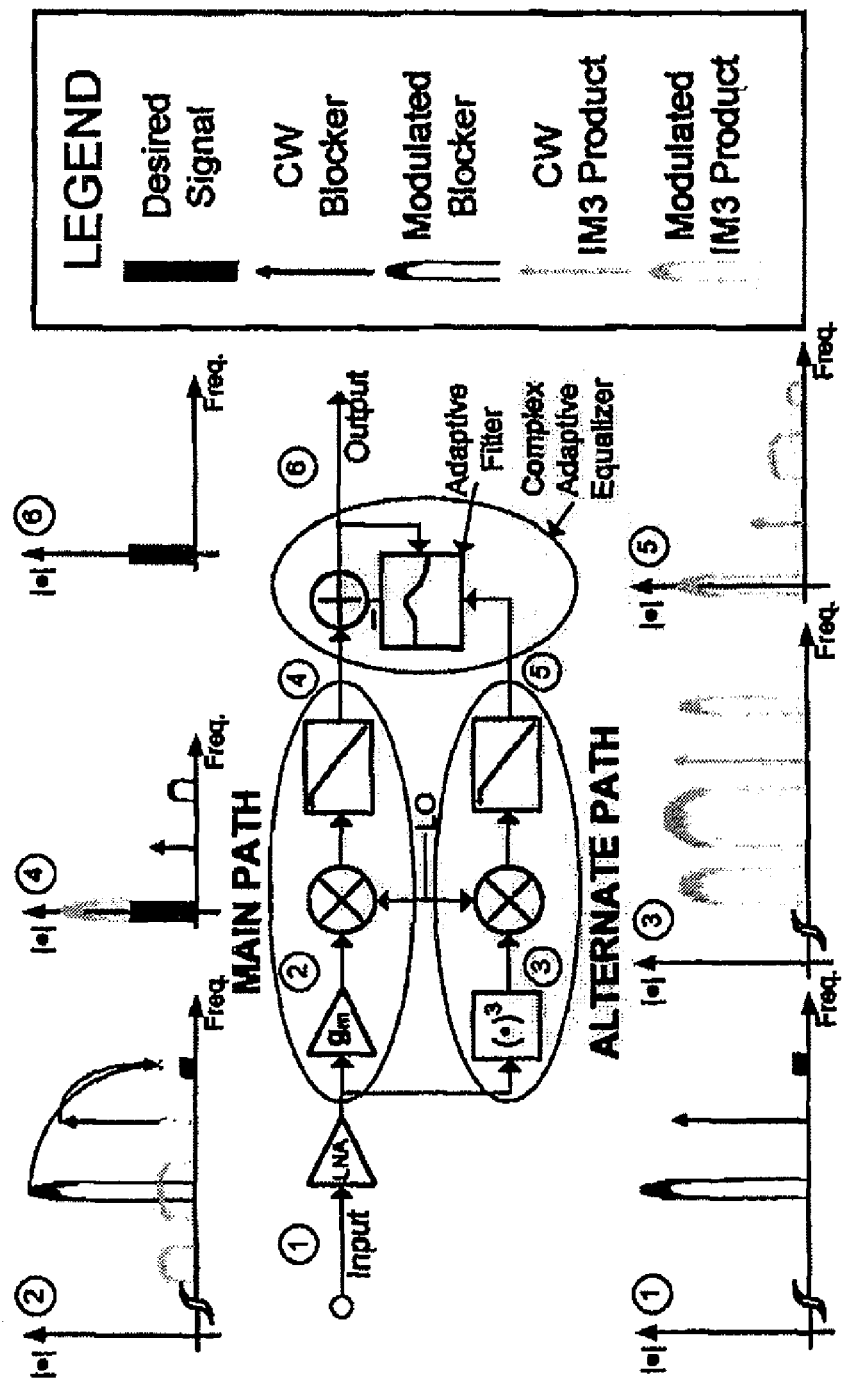
FIG. 2D shows one exemplary embodiment of a nonlinear main receiver path subjected to two large blockers along with an alternate receiver path.
Figure 3:
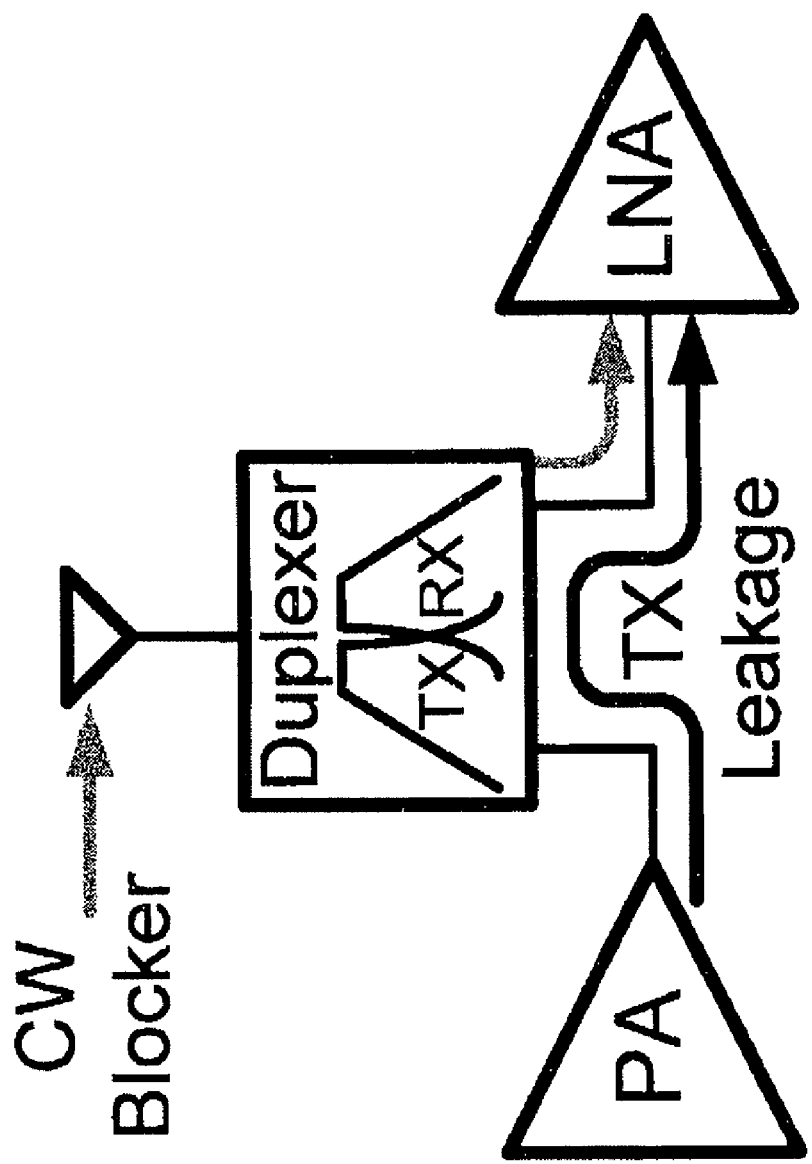
FIG. 3 shows a block diagram of a FDD receiver-transmitter illustrating the two tone blocking problem.

In an example illustrated by FIG. 2D, a nonlinear main receiver path is subjected to two large blockers such that the desired signal is overwhelmed by the self-generated IM3 interference products. The illustration of FIG. 2D reflects the fact that the UMTS out-of-band blocking specification is an implicit two-tone test with one of the "tones" being the modulated TX output leakage through the antenna duplexer, as shown in FIG. 3. FIG. 3 shows a block diagram of a FDD receiver-transmitter illustrating the two tone blocking problem. Reference IM3 products are generated at RF by a cubic term generator. The LO frequency of the alternate path mixer is set to be the same as that of the main path so that a proper set of IM3 products is downconverted to baseband frequencies. Baseband postfiltering attenuates to negligible levels unwanted IM3 products in the alternate path such that the adaptive equalizer converges based primarily on the statistics of the IM3 products corrupting the desired signal at baseband. Thus, the equalized IM3 products of the alternate path can be directly subtracted from the main path, leaving substantially only the desired RX signal. Note that this technique is not limited to a two-tone test but also removes IM3 products resulting from a three-tone test. Furthermore, this technique does not require prior knowledge of one or more of the blocker characteristics, as do prior art techniques that rely on the cancellation of TX leakage to meet the UMTS linearity specifications. Although both IM2 and IM3 products can be concurrently cancelled by parallel LMS adaptive filters, in our present prototypes, other techniques have been used to perform local IIP2 improvements in order to avoid adding additional ADCs to the system to pass reference IM2 products.

The present inventors previously described an alternate path IM3 cancellation technique where IM3 cancellation is performed following downconversion in U.S. Patent Application Ser. No. 60/938,937, Digital and Analog IM3 Product Compensation Circuits for an RF Receiver, filed May 18, 2007 and in U.S. patent application Ser. No. 11/751,363, filed May 21, 2007 and titled "Digital and Analog IM3 Product Compensation Circuits for an RF Receiver." Both the 60/938, 937 and 11/751,363 applications are incorporated herein by reference in their entirety.

Also, the techniques described herein differ from those presented by Estrick and Valkama by generating the reference IM3 products at analog RF rather than at digital baseband. It can be shown with trigonometric identities that the resultant downconverted IM3 products are the same as those that would have been produced by I and Q baseband cubic term generators. IM3 generation in the continuous-time domain as performed in this work is the preferred method in an integrated downconversion receiver since it permits the use of relatively narrowband postfilters and ADCs, such as those based on sigma-delta modulators ($\Sigma\Delta M$). For the architectures as described by Estrick and Valkama to cancel IM3 products for UMTS, the ADCs should pass the full spectrum of potential problematic blockers (1670 MHz-1850 MHz, 1920-1980 MHz, and 2015-2075 MHz) and would require at least 6 Nyquist ADCs and digital paths with sampling rates in excess of 60 MHz. Such requirements render this strategy unattractive and would consume far more power than the original mixed-signal and digital portion of the receiver. We realized furthermore that given that IM3 generation should therefore be performed in the analog domain, it should be done at RF after the low noise amplifier (LNA), where the blocker magnitudes are at their largest point in the receiver. The existence of large blocker magnitudes greatly facilitates high-quality IM3 generation, as the output signal of the IM3 term generator is smaller than the input by the nature of the cubing of signals.

Figure 4:
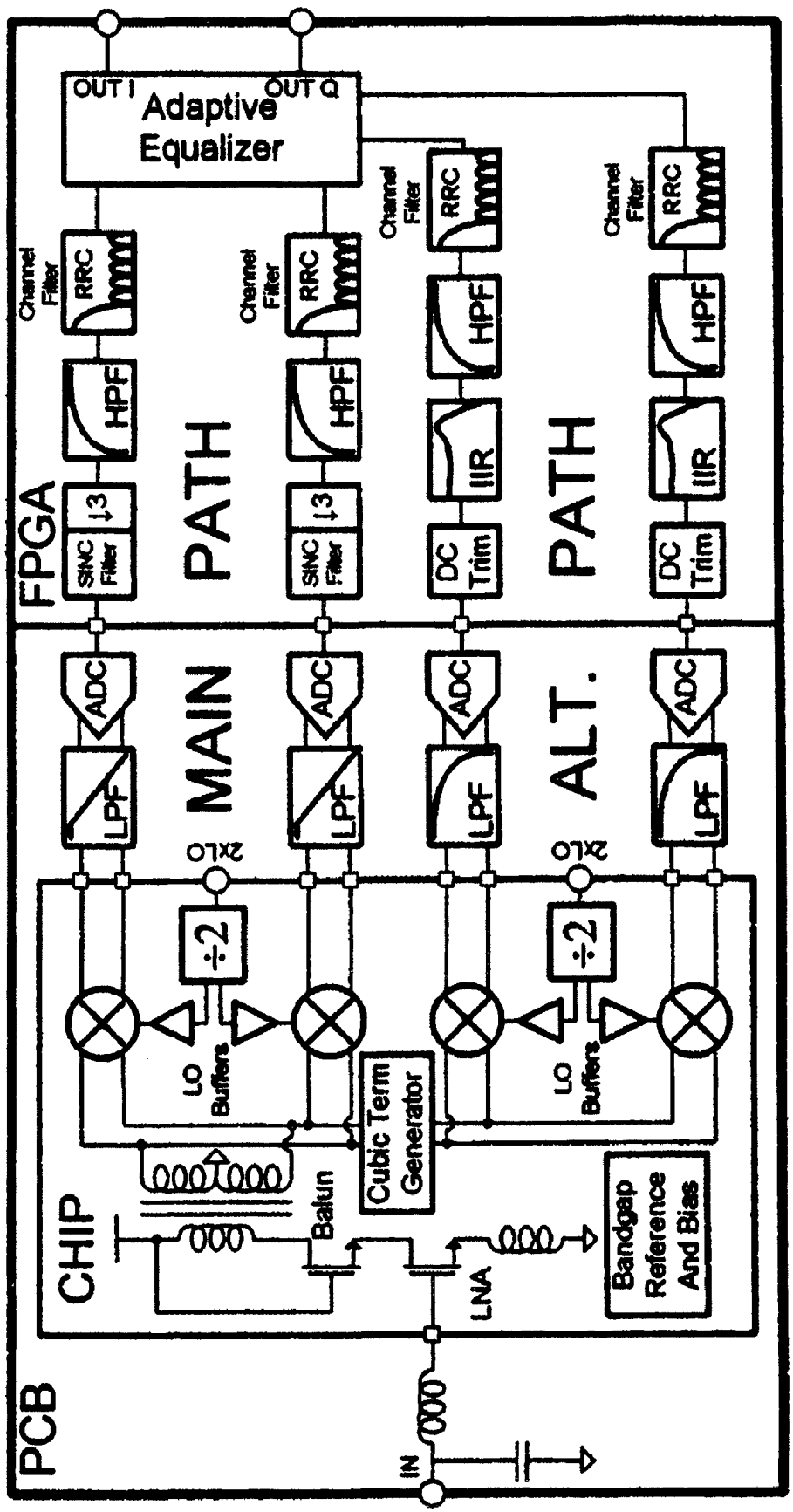
FIG. 4 shows one embodiment of a receiver architecture according to the invention.

FIG. 4 shows one embodiment of a receiver architecture according to the invention. In the embodiment of FIG. 4, a custom-designed front end is implemented in 130 nm RF CMOS. The chip is fully ESD protected and powered by a 1.2V power supply, except for the bandgap circuitry that is powered by a 2.7V power supply. In one embodiment, the chip is placed on a gold-plated dielectric substrate which is then mounted onto the PCB. Analog baseband circuitry is implemented on the PCB using low-power commercially available discrete components. Finally, a digital back end containing rate change, channel filtering, and equalization blocks is implemented on an FPGA platform.

Although it is possible to perform the equalization in analog circuitry, shifting as much of the signal processing to the digital domain affords several advantages. For example, the behavior of digital circuitry is relatively insensitive to process variations, the continued scaling of CMOS processes has rendered baseband digital blocks power-competitive compared to equivalent analog blocks, and digital circuits can more easily and economically facilitate the implementation of reconfigurable multimode receivers.

Regarding various layout and test configurations, implementing the baseband components off-chip has negligible impact on this experiment, as the integrated front end typically dominates the performance of the RF receiver. Also, in an actual implementation, the receiver main path could also include variable gain amplifier (VGA) functionality. The experimental receiver described herein was designed for proof-of-concept use to represent a case where the receiver was attempting to decode a signal near the sensitivity threshold. With a VGA added to the main path, and where VGA gain can be changed during alternate path operation, the equalizer can quickly track the change and maintain IM3 cancellation due to the adaptive nature of the alternate path.

Figure 5:
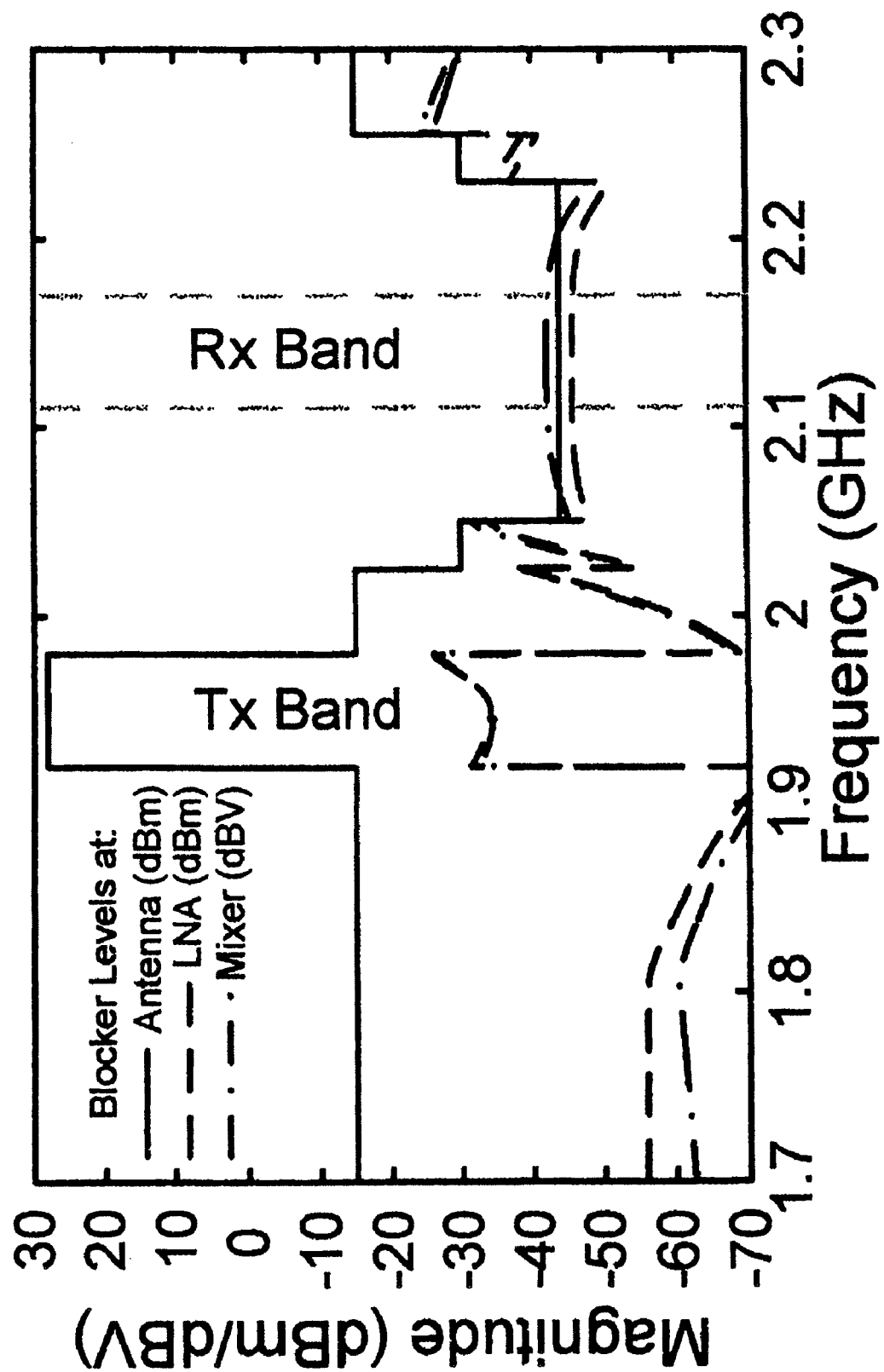
FIG. 5 shows a graph illustrating an expected UMTS blocker profile at various points in the frequency domain near the intended LO frequency of the receiver.

In order to determine a worst-case blocking (alternatively denoted as peak blocking) scenario seen by the receiver circuitry, the UMTS blocker specification should be used in conjunction with the frequency response of the duplexer as shown in FIG. 3. FIG. 5 shows a graph illustrating an expected UMTS blocker profile at various points over the receiver's bandwidth. From FIG. 5 it can be seen for an exemplary duplexer, such as a muRata Part no. DFYK61 G95LBJCA duplexer (available from muRata Electronics of Smyrna, Ga.), that the largest IM3 products occur when $f_{TX}$=1.98 GHz, $f_{CW}$=2.05 GHz, and $f_{RX}$=2.12 GHz. In this case, the blocker powers are $P_{TX}$+28 dBm and $P_{CW}$=−30 dBm at the antenna and $P_{TX}$=−26 dBm and $P_{CW}$=−34 dBm at the LNA input. Interestingly, in this case, the worst-case blocking scenario does not occur over the band in which the specified CW blocker is −15 dBm.

According to at least one interpretation, the UMTS specifications imposes an analog requirement of $NF_{ANT,MAX}$=9 dB at the antenna. Adopting a more general definition of NF, denoted herein as error figure (EF) to encompass other forms of error including distortion products, the UMTS specification allows EF=NF+3 dB under blocking conditions. In other words, $EF_{ANT,MAX}$=12 dB. Given the insertion loss of the exemplary duplexer $L_{DUP}$=1.8 dB and that $NF_{ANT}$=$L_{DUP}$+$NF_{RX}$, it can be computed that $NF_{RX,MAX}$=7.2 dB and $EF_{RX,MAX}$=10.2 dB at the LNA input.

For UMTS, the noise due to the 50Ω source resistance is kTB=−108 dBm/3.84 MHz at the LNA input. Denoting all quantities as LNA input-referred, this implies that after removing source noise, the maximum allowed receiver noise power is $N_{RX,MAX}$=−101.7 dBm/3.84 MHz. Assuming that the error under worst-case blocking is dominated by thermal noise and IM3 distortion, the error figure limit implies that the rms sum of $I_{RX,MAX}$ and $N_{RX,MAX}$ is −98.2 dBm/3.84 MHz, where $I_{RX,MAX}$ is the maximum allowed IM3 distortion product power. It follows that $I_{RX,MAX}$=−100.8 dBm/3.84 MHz. Using these values in EQ. 1 below yields $IIP3_{RX,MIN}$+3.4 dBm.

$$IIP3_{RX,MIN} = \frac{1}{2}[2P_{CW} + P_{TX} - I_{RX,MAX}] \quad (1)$$

The problem with this requirement is that it is inconsistent with typical attainable values for SAW-less receivers in the absence of special enhancements. For example, it has been reported that typical values for $IIP3_{MIXER}$ range from +8 to +12 dBm. For the initial design in this work, the simulated values for $G_{LNA}$ and $IIP3_{LNA}$ are +17 dB and +6 dBm, respectively. Recalling the IIP3 relation of EQ. 2 such design values yield $IIP3_{RX}$=−9.1 dBm for a mixer IIP3 of +8 dBm.

$$IIP3_{RX} = \left(\frac{1}{IIP3_{LNA}} + \frac{G_{LNA}}{IIP3_{MIXER}}\right)^{-1} \quad (2)$$

It can be seen that a significant discrepancy arises and that some sort of additional IIP3 enhancement is required to meet the input-referred error specification.

We now introduce a new term, the "IM3 product-to-error ratio" (IER) which is useful for designing feedforward linearity enhancements as described herein. In this case, the "E" term represents all error except for IM3 products. The IER of the main path under peak blocking conditions ($IER_{MAIN,PK}$) can be determined using the receiver IIP3 value in the previous paragraph. Using EQ. 1, the LNA input-referred main path IM3 product magnitude under peak blocker conditions $I_{MAIN,PK}$ is equal to −75.8 dBm/3.84 MHz. Adding 2 dB of margin to the NF requirements and assuming that $EF_{RX,MAX}$=$NF_{RX,MAX}$+2 dB (allowing 1 dB margin for error due to the alternate path), the maximum error, including 50Ω source noise but not IM3 products, referred to the main path LNA input is $E_{MAIN,PK}$=−100.8 dBm. Hence, $IER_{MAIN,PK}$=25 dB. One aspect of the usefulness of this number is that it can be used to determine the required dynamic range of the alternate path of a receiver as described herein.

Figure 6B:
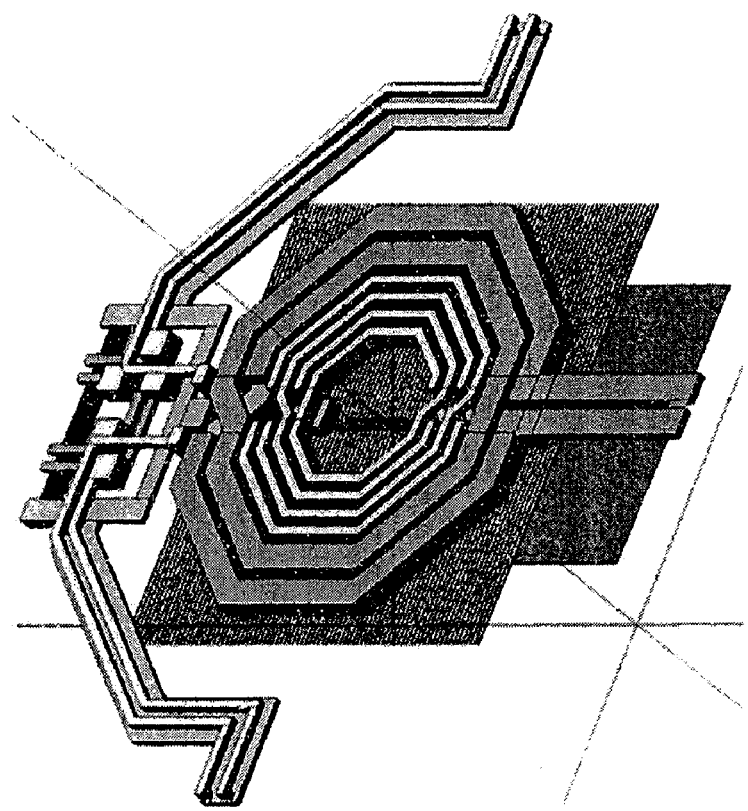
FIG. 6B shows a 3D CAD representation of an exemplary balun.
Figure 6A:
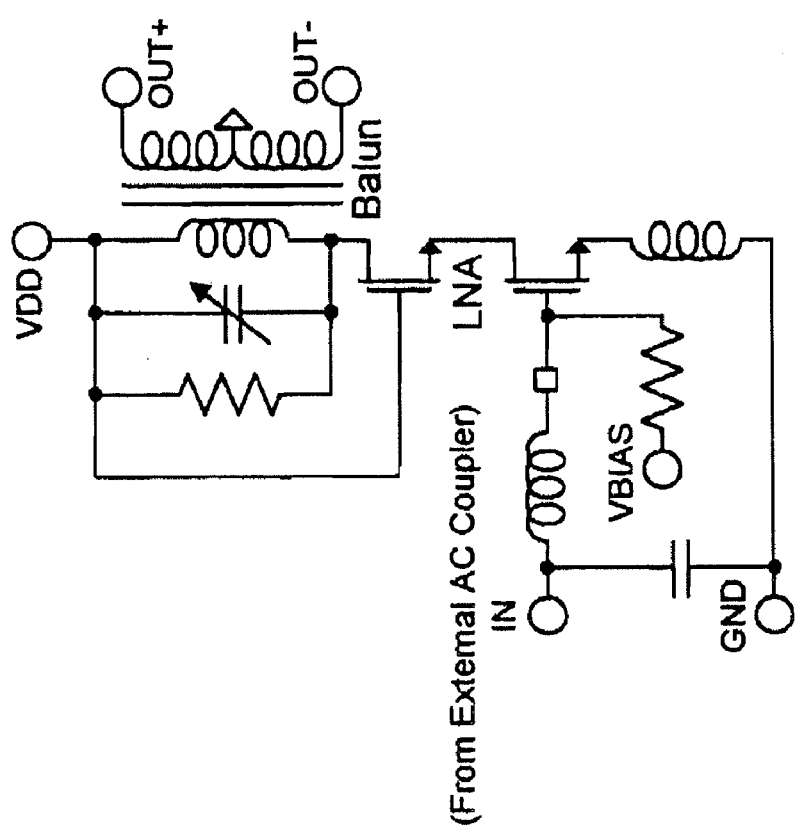
FIG. 6A shows a schematic diagram of an exemplary LNA and balun.

Turning now to an exemplary receiver main path block design according to the invention, we begin by discussing an LNA and balun. Reflecting a typical choice for narrowband receivers, the integrated front end can employ an inductively degenerated cascode LNA. As the exemplary duplexer discussed above has a single ended output, the LNA should also have a single ended input. However, as the SAW filter to be removed for this design previously handled the single-ended to differential conversion between the LNA and mixer, provisions for performing this task are now be made on-chip. One area-efficient method of accomplishing this goal is to place a secondary inductor winding inside of the LNA load inductor, thus creating a transformer balun. Suitable LNA and balun designs are depicted in FIG. 6A and FIG. 6B. FIG. 6A shows a schematic diagram of the exemplary LNA and balun. FIG. 6B shows 3D CAD representation of the exemplary balun.

Turning to the Mixer and LO Buffer, as the exemplary prototype embodiment discussed herein was designed to equalize IM3 products, the mixer uses a folded high-IIP2 mixer in order to obviate any IM2 equalization. (Liscidini, et al., "A 0.13 mm CMOS Front-End for DCS1800/UMTS/802.11b-g with Multiband Positive Feedback Low-Noise Amplifier," IEEE Journal of Solid-State Circuits, vol. 41, no. 4, pp. 981-989, April 2006).

Figure 7:
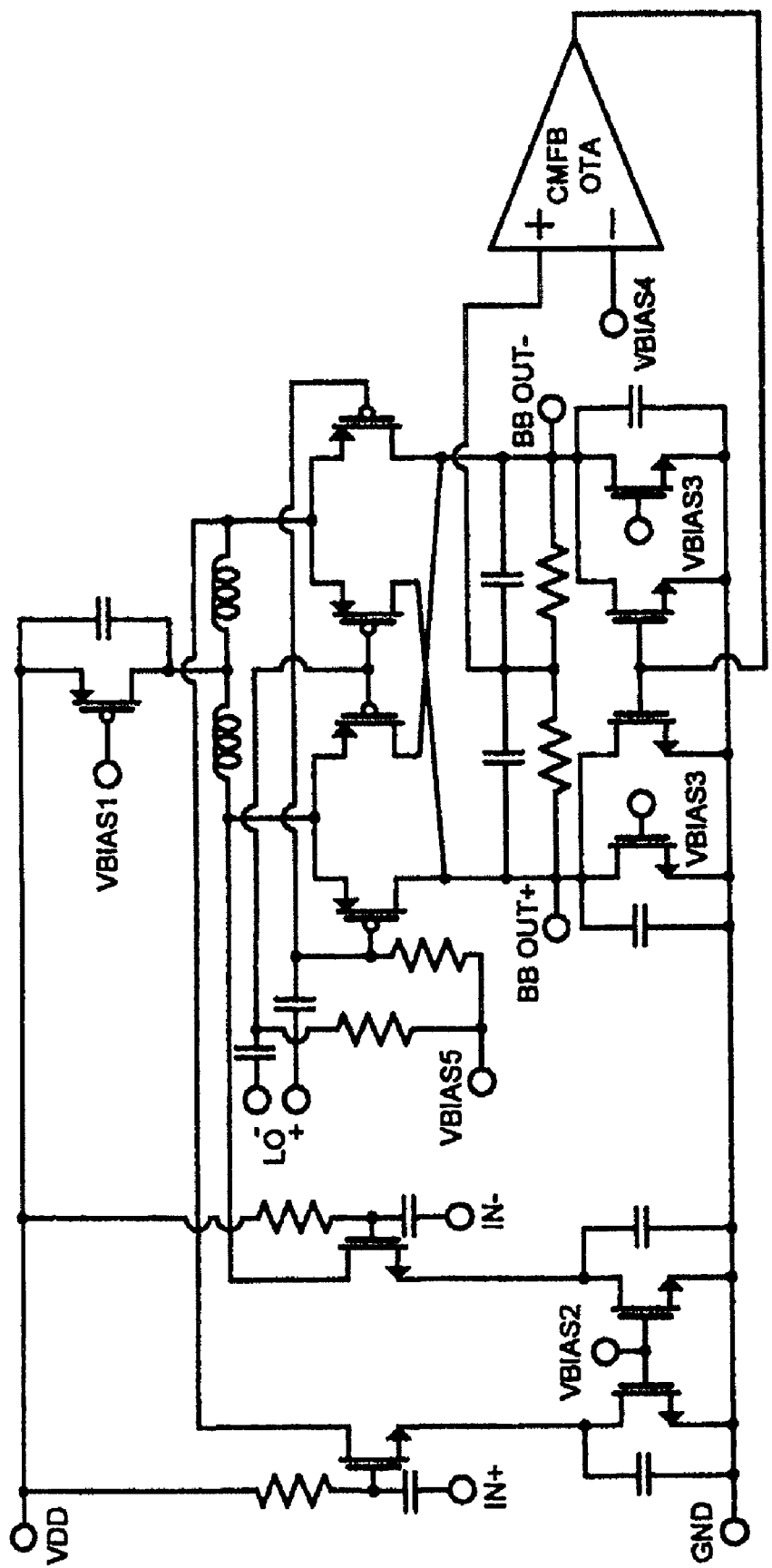
FIG. 7 shows a schematic of an exemplary mixer.
Figure 8:
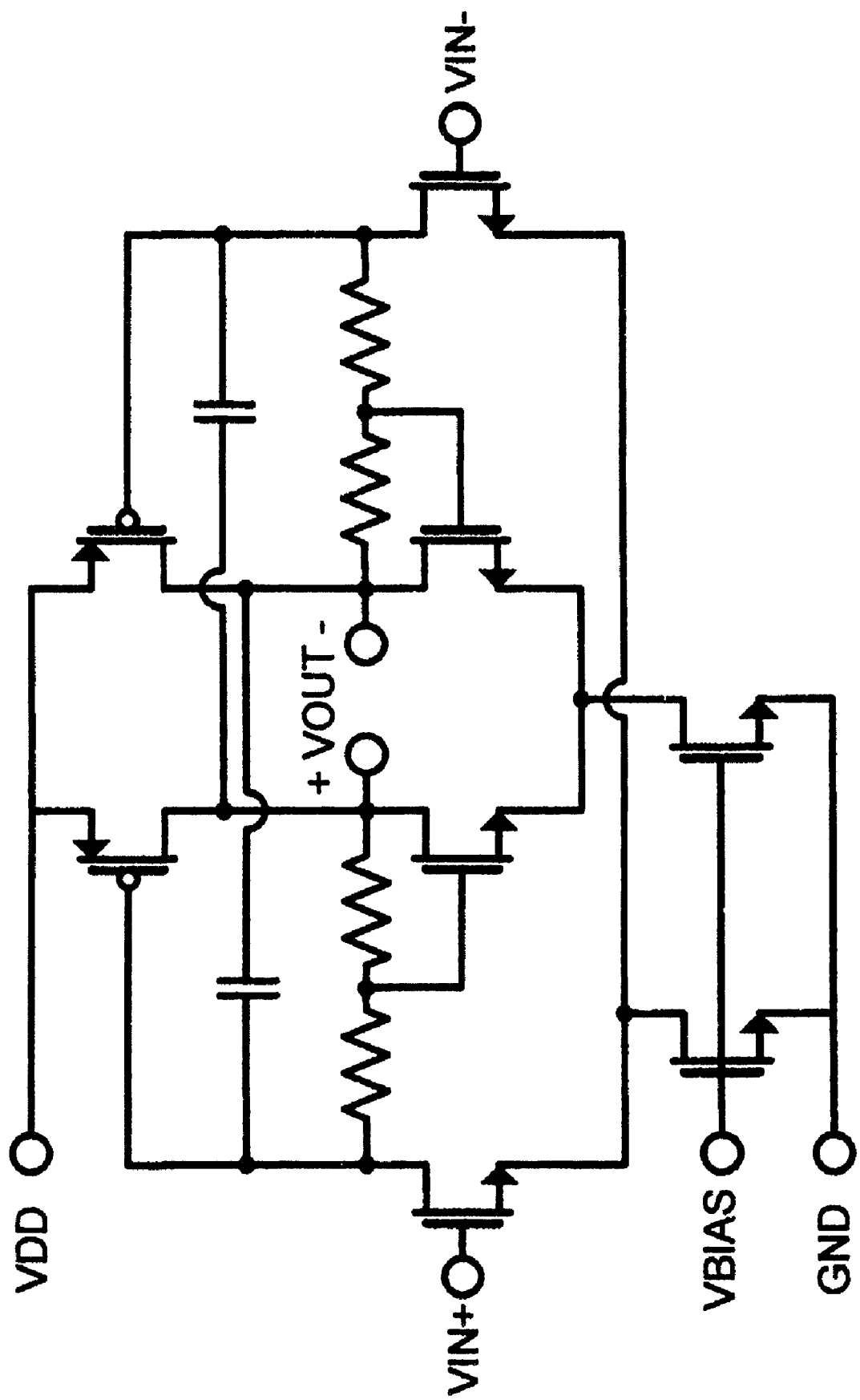
FIG. 8 shows a schematic diagram of an exemplary main path LO buffer.

FIG. 7 shows a schematic of one such mixer as implemented. In order to drive the large gate capacitances of the mixer switching pair, an actively loaded Cherry-Hooper LO buffer was used. FIG. 7 shows a schematic of an exemplary main path LO buffer. The schematic diagram of FIG. 8 reflects some biasing and neutralization modifications to the circuit shown by Floyd, et al. in "WCDMA Direct-Conversion Receiver Front-End Comparison in RF-CMOS and SiGe BiCMOS" (IEEE Transactions on Microwave Theory and Techniques, vol. 53, pp. 1181-1188, April 2002). This permits the circuit to function under the low voltage supply headroom. Separate divide-by-two circuits as noted by were included immediately adjacent to the LO buffers in order to avoid problems associated with on-chip RF-LO coupling.

Turning to the analog and digital baseband circuitry, the desired order of the analog postfilter can be obtained by considering a worst-case frequency translation to baseband of the blocker profile depicted in FIG. 5 after the LNA transfer function is added to the profile. It was found that for an ADC sampling rate of 50 MHz, a $3^{rd}$-order Chebyshev filter in the analog domain was sufficient to attenuate downconverted out-of-band blocker signals to levels negligible with respect to the thermal noise floor. The Chebyshev filter was implemented on a PCB with a nominal passband edge frequency of 2.3 MHz with the real pole formed by the output stage of the mixer. The filter also includes an additional gain stage that drives the ADC, which uses an 8-bit pipelined architecture. The ADC sampling rates were chosen to be not equal to a multiple of the UMTS chip rate in order to facilitate testing with the particular FPGA platform used. However, as the baseband digital signal is oversampled, this choice did not compromise the integrity of the experiments presented herein. Coarse DC offset adjustments prior to the digital high pass filters (HPFs) were also implemented to avoid saturating the baseband circuitry. Close-in adjacent channel filtering is provided in the digital domain by a 25-tap root-raised cosine FIR filter running at 16.66 MHz.

Now turning to the alternate path block design, as mentioned hereinabove, a useful metric for the design of the alternate path is its IER under peak blocking conditions: $IER_{ALT,PK} = I_{ALT,PK}/E_{ALT,PK}$. Denoting the gain of the main path as $G_{MAIN}$ and the gain of the alternate path from the IM3 term generator to the output of the adaptive equalizer as $G_{ALT}$, it can be seen that the adaptive equalizer forces $G_{MAIN}I_{MAIN,PK} = G_{ALT}I_{ALT,PK}$, with any discrepancy in this equality counting towards $IER_{ALT,PK}$. To obtain $EF_{RX,MAX}$, all error is referred to the output of the equalizer in EQ. 3:

$$EF_{RX,MAX}(dB) = 10 \log_{10}\left(\frac{E_{MAIN,PK}^2 G_{MAIN}^2 + E_{ALT,PK}^2 G_{ALT}^2}{G_{MAIN}^2 kTB}\right) \quad (3)$$

From the equality forced by the adaptive equalizer, substitution yields EQ. 4.

$$EF_{RX,MAX}(dB) = 10 \log_{10}\left(\frac{E_{MAIN,PK}^2}{kTB}\right) + 10 \log_{10}\left(1 + \frac{IER_{MAIN,PK}^2}{IER_{ALT,PK}^2}\right) \quad (4)$$

The second term in EQ. 4 represents the excess error figure due to the operation of the alternate path. Given the design numbers expressed hereinabove, $IER_{ALT,PK} > 31$ dB. For simplicity, this error requirement is split equally between the cubic term generator and the remainder of the alternate path, yielding $IER_{CUB,PK} > 34$ dB.

Turning to the cubic generator, since the cubic term generator is an unconventional block in a receiver, we begin with the desired specifications. Aside from that of IER mentioned above, the circuit should heavily attenuate the incoming desired signal (i.e. linear term feedthrough) with respect to the IM3 products. This is visually depicted at point 3 of FIG. 2D where no discernible desired signal is present. The reason for heavy attenuation of the incoming desired signal is that any desired signal at the reference input of the equalizer will be treated as error by the adaptive algorithm. As the algorithm functions so as to minimize mean squared error, it will attempt to strike a balance between eliminating the IM3 products and desired signal, reducing small signal gain, IM3 cancellation, or both.

The cubic term generator error that contributes to IER is composed of both thermal noise and other nonlinear terms. One reasonable design procedure is to ensure that the IER due to higher order harmonic products under peak blocking conditions is significantly larger than the IER requirement. This requirement can be verified in simulation with a harmonic balance simulation, varying the number of calculated harmonics in order to isolate the magnitude of higher-order terms that fall around the same frequency as the IM3 products.

Prior art cubic term generators, or expansions thereof, have been reported to generate predistortion of nonlinear transmitter power amplifiers. Early prior art circuits as reported by Nojima et al. in "Cuber Predistortion Linearizer for Relay Equipment in 800 MHz Band Land Mobile Telephone System" (IEEE Transactions on Vehicular Technology, vol. VT-34, pp. 169-177, November 1985), and Imai, et al. in "Novel Linearizer Using Balanced Circulators and Its Application to Multilevel Digital Radio Systems" (IEEE Transactions on Microwave Theory and Techniques, vol. 37, pp. 1237-1243, August 1989), used the crossover distortion characteristic of back-to-back diodes. Subsequent developments in predistortion circuits as reported by Westesson, et al. in "A Complex Polynomial Predistorter Chip in CMOS for Baseband or IF Linearization of RF Power Amplifiers" (Proceedings of the IEEE International Symposium on Circuits and Systems (ISCAS '99) Vol. 1, pp. 206-209, June 1999), Nesimoglu, et al. in "A Broadband Polynomial Predistorter for Reconfigurable Radio" (Vehicular Technology Conference, 2001, Vol. 3, pp. 1968-1972, May 2001), and Rahkonen, et al. in "Performance of an Integrated 2.1 GHz Analog Predistorter" (2006 International Workshop on Integrated Nonlinear Microwave and Millimeter-Wave Circuits, pp. 34-37, January 2006) used networks of cascaded Gilbert cell mixers, while architectures explicitly utilizing the third-order Taylor series coefficient of the MOS transistor have been reported as well, such as, for example, by Shearer, et al. in "A Precision CMOS Analog Cubing Circuit" (IEEE NEWCAS, pp. 281-284, June 2004).

Figure 9:
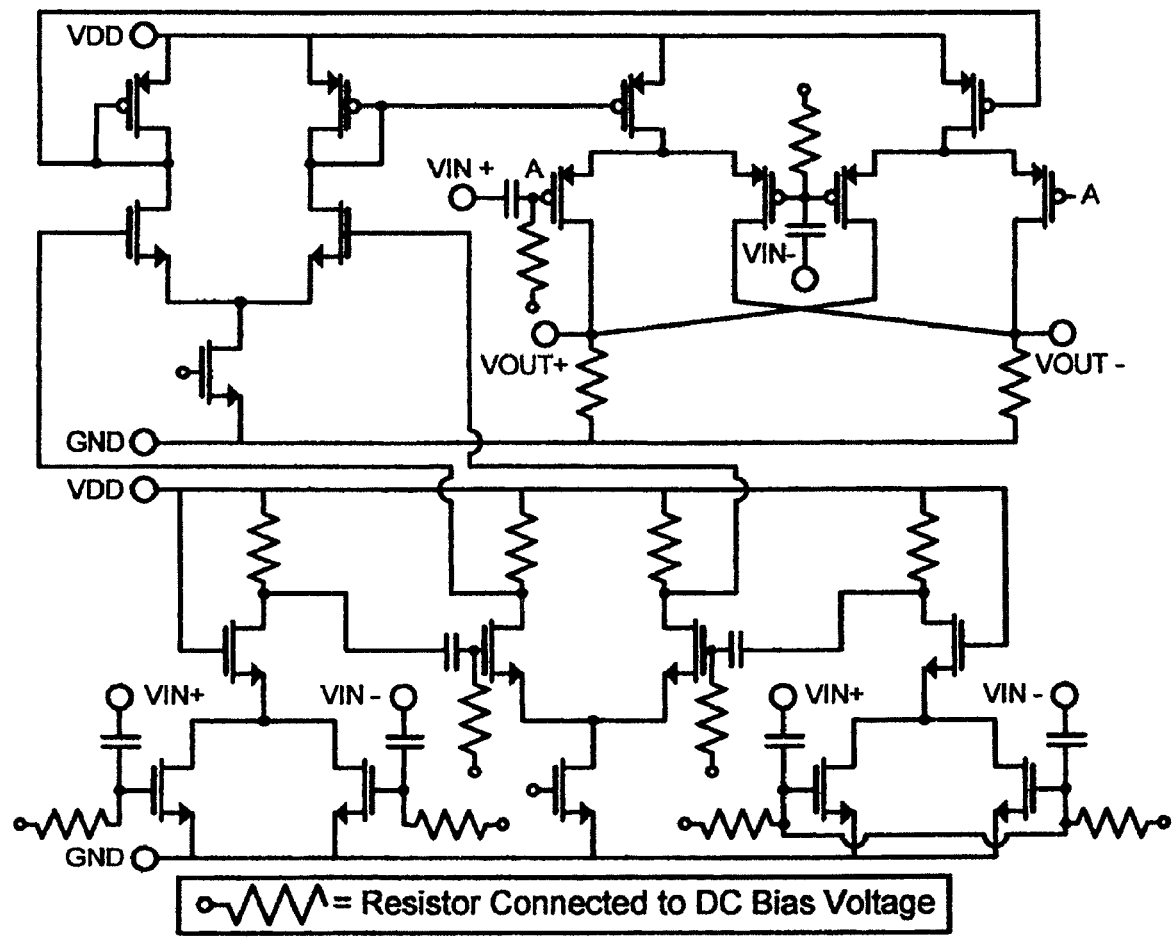
FIG. 9 shows one embodiment of a schematic diagram of an exemplary cubic term generator.

FIG. 9 shows a schematic diagram of one embodiment of an exemplary cubic term generator, including a source coupled transistor pair. The exemplary cubic term generator of FIG. 9 is suitable for us in alternate path receivers as described herein. Similar to Nesimoglu's generator, the cubing was broken up into two suboperations, a choice that potentially realizes an IM3-to-noise ratio (INR) benefit over architectures such as described by Shearer in that the initial distortion products are only attenuated with respect to the noise of the distortion-producing devices as the square rather than the cube of the input signal. In this case, however, the initial operation is performed by a canonical MOS squaring circuit, located at the lower left of the schematic of FIG. 9. This choice was made in order to avoid the generation of higher-order intermodulation products associated with the nonlinearity of the Gilbert cell current commutating devices. As the MOS squaring circuit produces a single ended output, it should be followed by an active balun to recast the signal differentially. One potential issue with this scheme is that the squaring circuit directly passes common mode signal. If the balun negative terminal were grounded, the common mode signal would be recast differentially and would propagate through the remainder of the circuit. In order to provide some measure of common mode rejection, a dummy squaring circuit was added to the negative terminal of the balun. With the gate terminals of the dummy squaring circuit tied together, this circuit only passes common mode signal. Hence, the common mode signal is rejected by the CMRR of the balun and subsequent gain circuits.

The final multiplication of the cubic term generator is performed by a Gilbert cell multiplier. In this case, the non-linearity of the current commutating devices can be improved at the expense of gain by increasing the multiplying device overdrive voltages. The lost gain can then be made up earlier in the circuit. The circuit as implemented for testing purposes is somewhat power-inefficient due to the voltage output at RF. In a more power efficient commercial implementation, the IM3 reference signal can be passed to mixer switching pairs solely in the current mode.

Note that in this architecture, linear term rejection will be limited only by device mismatch and coupling, an effect expected to be negligible. Furthermore, the circuit has been verified in simulation to produce higher-order nonlinear terms at levels well below the required alternate path error floor for the two cases of when the nominally CW blocker from as described by the UE Radio Transmission and Reception (FDD) specification, is CW and amplitude-modulated with suppressed carrier.

Figure 10:
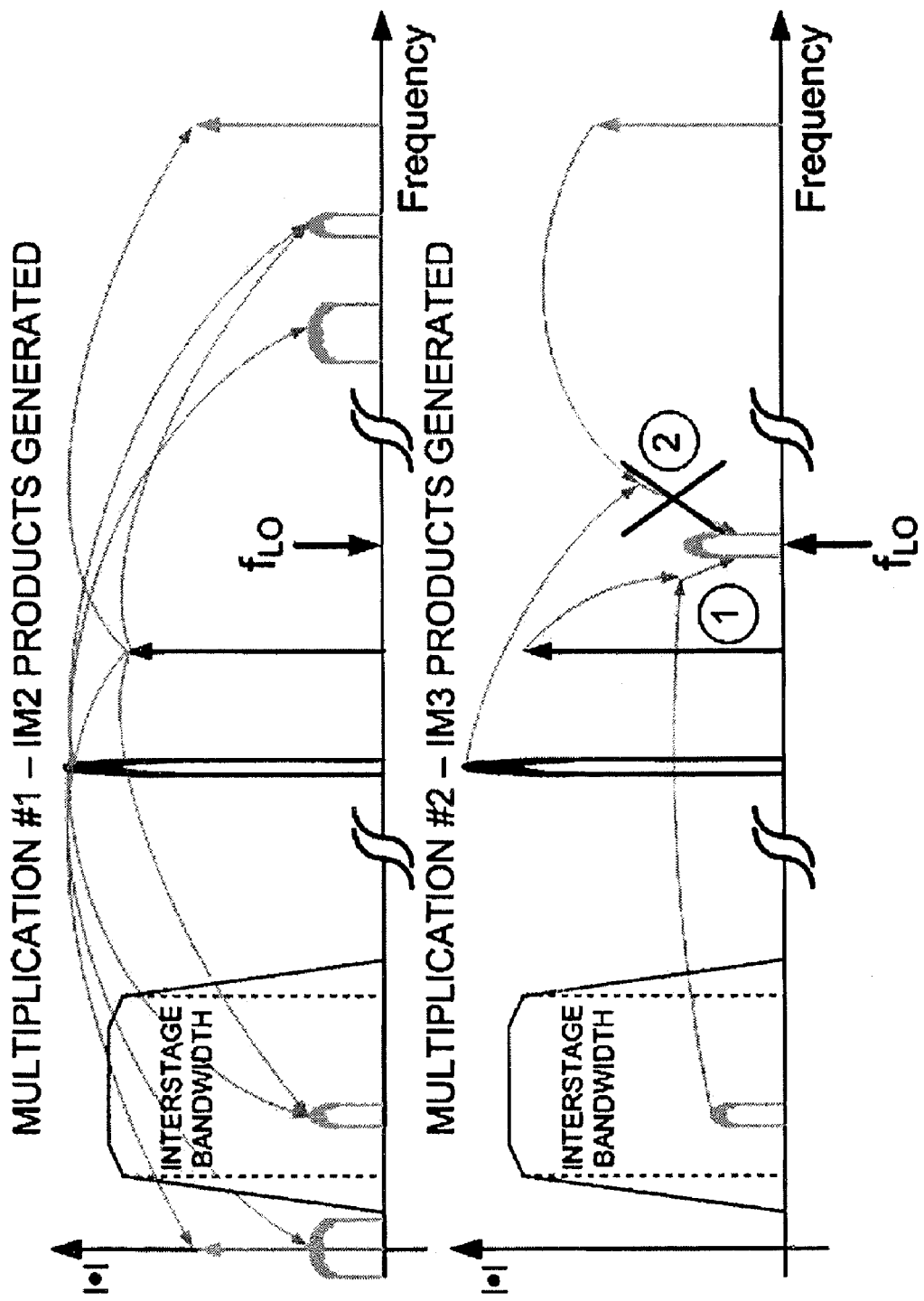
FIG. 10 shows a graph of a frequency domain depiction of a distributed cubic term generator circuit.

Now turning to the bandlimited nature of the cubic term generator, the alternate path needs to accurately reproduce only the subset of IM3 products that land around $f_{LO}$ in the main path. It can be proven via trigonometric identities that in order to achieve this in the specified UMTS blocking condition, only the IM2 content around the two-tone beat frequency needs to be retained in the cubic term generator interstage circuitry, as depicted in FIG. 10. For UMTS, the beat frequency range is from 65-250 MHz, which is much less than the 4.15 GHz bandwidth required to retain all of the IM2 products generated by the initial squaring circuit. Similarly, in the more general case where IM3 products arise from three arbitrary quadrature-modulated blockers, only signal content from around one of two relevant beat frequencies needs to be retained in order to reproduce the required IM3 products. Thus, the bandwidth of the interstage circuitry can be reduced dramatically, allowing the designer to obtain large amounts of gain for relatively little power by taking advantage of the gain-bandwidth principle. Successful exploitation of this relationship can considerably reduce the effective noise contribution of the final Gilbert cell multiplier and subsequent alternate path circuitry.

Unlike multistage predistortion circuits such as have been reported by Westesson, et al. in "A Complex Polynomial Predistorter Chip in CMOS for Baseband or IF Linearization of RF Power Amplifiers" (Proceedings of the IEEE International Symposium on Circuits and Systems (ISCAS '99) Vol. 1, pp. 206-209, June 1999), Nesimoglu, et al. in "A Broadband Polynomial Predistorter for Reconfigurable Radio" (Vehicular Technology Conference, 2001, Vol. 3, pp. 1968-1972, May 2001), and Rahkonen, et al. in "Performance of an Integrated 2.1 GHz Analog Predistorter" (2006 International Workshop on Integrated Nonlinear Microwave and Millimeter-Wave Circuits, pp. 34-37, January 2006), the receiver cubic term generator does not need to retain IM2 products around DC for general blocker signals once high-frequency IM2 products are removed. Filtering out IM2 products near DC increases the maximum total blocker signal magnitude for which the receiver cubic term generator meets IER requirements. This is especially true for standards such as UMTS Region 1 in which the two IM3 producing signals of interest have significantly different amplitudes. In such cases, the total IM2 energy around DC is considerably larger than the IM2 energy around the beat frequency, and if left unattenuated would dictate the compression point of the interstage circuitry without contributing to IM3 products around $f_{LO}$.

Turning now to the alternate path mixer and LO buffer, both the alternate path mixer and the LO buffer are reduced versions of their counterparts in the main path. In this case, the "blockers" seen by the mixer are the undesired IM3 products as depicted at points 3 and 5 in FIG. 2D. For the peak blocking condition, the power of these signals is on the same order of magnitude as that of the desired IM3 products. Hence, the required dynamic range of the mixer is small and the linearity and noise specifications for these blocks can be determined to be quite relaxed. Therefore, the IIP2-enhancing tuning inductor of the mixer can be removed, while the gate capacitances of the switching devices are substantially reduced. Also, a set of relatively simple differential pair amplifiers can be used for the LO buffering.

One exemplary alternate path analog postfiltering scheme (analog baseband circuitry) includes a first-order real pole at the output of the mixer and another first-order real pole embedded into an active-RC buffer, which drives an 8-bit pipelined ADC running at 16.66 MHz. In one prototype implementation on PCB, the analog portion of the alternate path baseband circuitry consumed less than 7.6 mA from a 2.7V supply. Power consumption can be further reduced in a fully integrated design. The procedure used to set specifications on the alternate path baseband postfiltering is different from that of the main path in that the properties of the undesired "blocker" IM3 products in this case depend on those of the desired IM3 products. An algorithmic procedure that takes this relationship into account is thus required. Such a procedure shows that if the mixer output pole is at $f_{-3dB}$=1.5 MHz and the buffer pole is at $f_{-3dB}$<8 MHz, then the error due to unwanted aliased IM3 products is negligible with respect to the alternate path noise floor. More importantly, this procedure shows that if the system proposed in this paper were implemented monolithically with a sigma-delta ADC running at or around 50 MHz, then only the first-order pole at $f_{-3dB}$=1.5 MHz can be used, greatly simplifying this portion of the receiver design.

Figure 11:
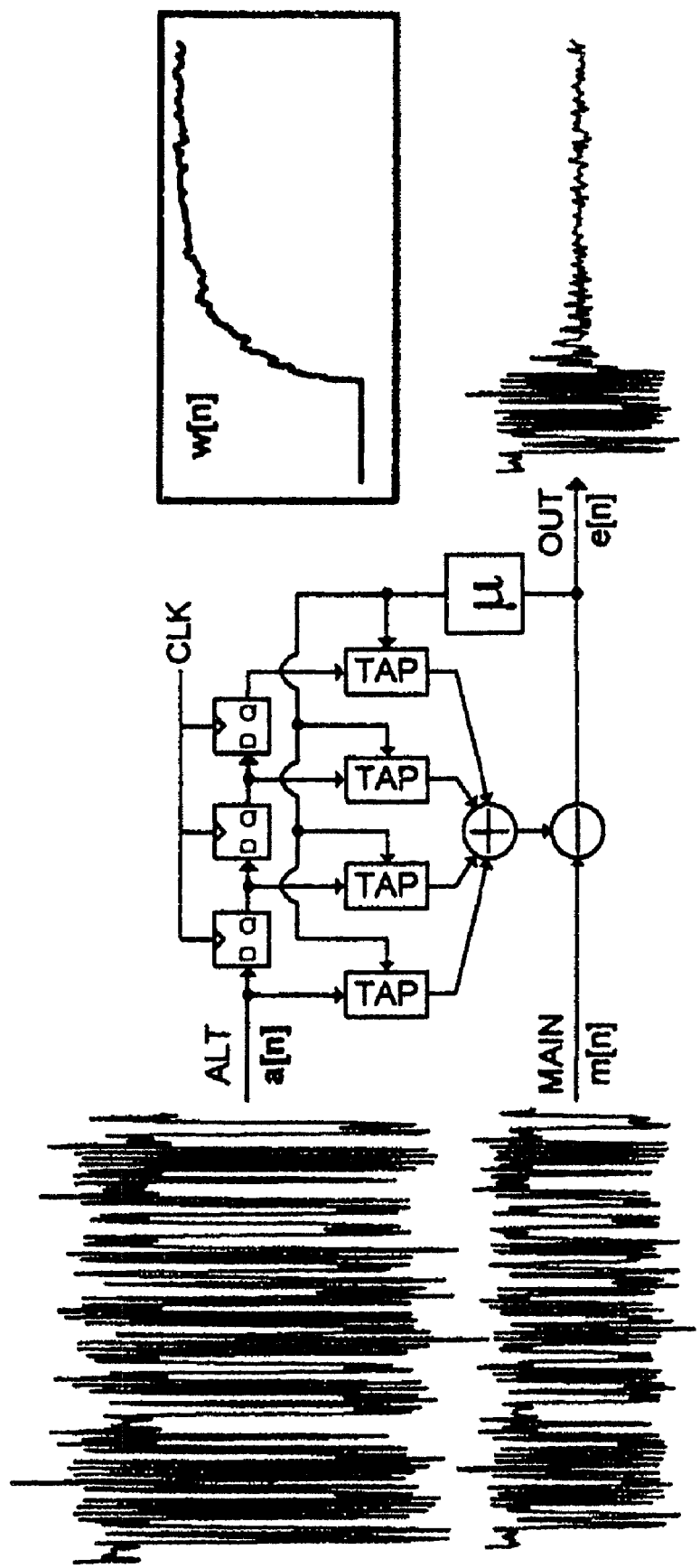
FIG. 11 shows an exemplary LMS filter with simulated waveforms.

Turning now to digital equalization, as discussed by Haykin in Adaptive Filter Theory (Upper Saddle River, N.J.: Prentice Hall, 2002, Chapter 5), LMS-based adaptive equalizers have been used in power-constrained applications due to their simplicity and robustness. In one exemplary implementation of an alternate path receiver according to the invention, the normalized least mean square (NLMS) algorithm was used, as its convergence speed has been reported by Tarrab et al. in "Convergence and Performance Analysis of the Normalized LMS Algorithm with Uncorrelated Gaussian Data" (IEEE Transactions on Information Theory, vol. 34, pp. 680-691, July 1988), Slock, et al. in "On the Convergence Behavior of the LMS and Normalized LMS Algorithms" (IEEE Transactions on Signal Processing, vol. 41, pp. 2811-2825, September 1993), and Nascimento in "A Simple Model for the Effect of Normalization on the Convergence Rate of Adaptive Filters" (IEEE Int. Conference on Acoustics, Speech, and Signal Processing (ICASSP) Dig. Tech. Papers vol. 2, pp. 453-6, May 2004) as potentially superior to that of LMS. The dynamics of the NLMS algorithm are also much less sensitive to the properties of the input signal than are those of LMS as reported by Haykin and Slock, indicating more predictable behavior over a wide range of conditions. The concept behind LMS-based adaptive equalization is depicted in FIG. 11. Here, a time-varying FIR filter is utilized to modify a reference signal and to subtract it from an incoming signal corrupted by a version of the same reference signal. The taps of the FIR filter are adjusted based on the instantaneous correlation estimate between the equalizer output and the reference signal. That is, if there is any signal correlated with the reference signal in the equalizer output, each tap is adjusted on average in a direction so as to reduce the reference signal content in the output. If the equalizer is designed properly, the filter taps will converge close to a solution that yields the minimum mean squared output signal, while also typically exhibiting a small excess error around that solution.

The operation of the two equalizers in their canonical complex form is described by EQ. 5, with bold symbols denoting column vector quantities and the italicized portions corresponding to the NLMS algorithm alone.

$$e[n] = m[n] - w^H[n]a[n];$$
$$w[n+1] = w[n] + \tilde{\mu}e[n]a[n];$$
$$\tilde{\mu} = \frac{\mu}{\|a[n]\|^2}$$
(5)

When expanded into a physical hardware implementation, EQ. 5 takes the form of EQ. 6, EQ. 7, and EQ. 8.

$$\tilde{\mu} = \frac{\mu}{\|a_I[n]\|^2 + \|a_Q[n]\|^2}$$
(6)

$$e_I[n] = m_I[n] - w_I^T[n]a_I[n] + w_Q^T[n]a_Q[n];$$
$$e_Q[n] = m_Q[n] - w_Q^T[n]a_I[n] - w_I^T[n]a_Q[n]$$
(7)

and $$w_I[n+1] = w_I[n] + \tilde{\mu}[e_I[n]a_I[n] + e_Q[n]a_Q[n]];$$
$$w_Q[n+1] = w_Q[n] + \tilde{\mu}[e_Q[n]a_I[n] - e_I[n]a_Q[n]]$$
(8)

Figure 12:
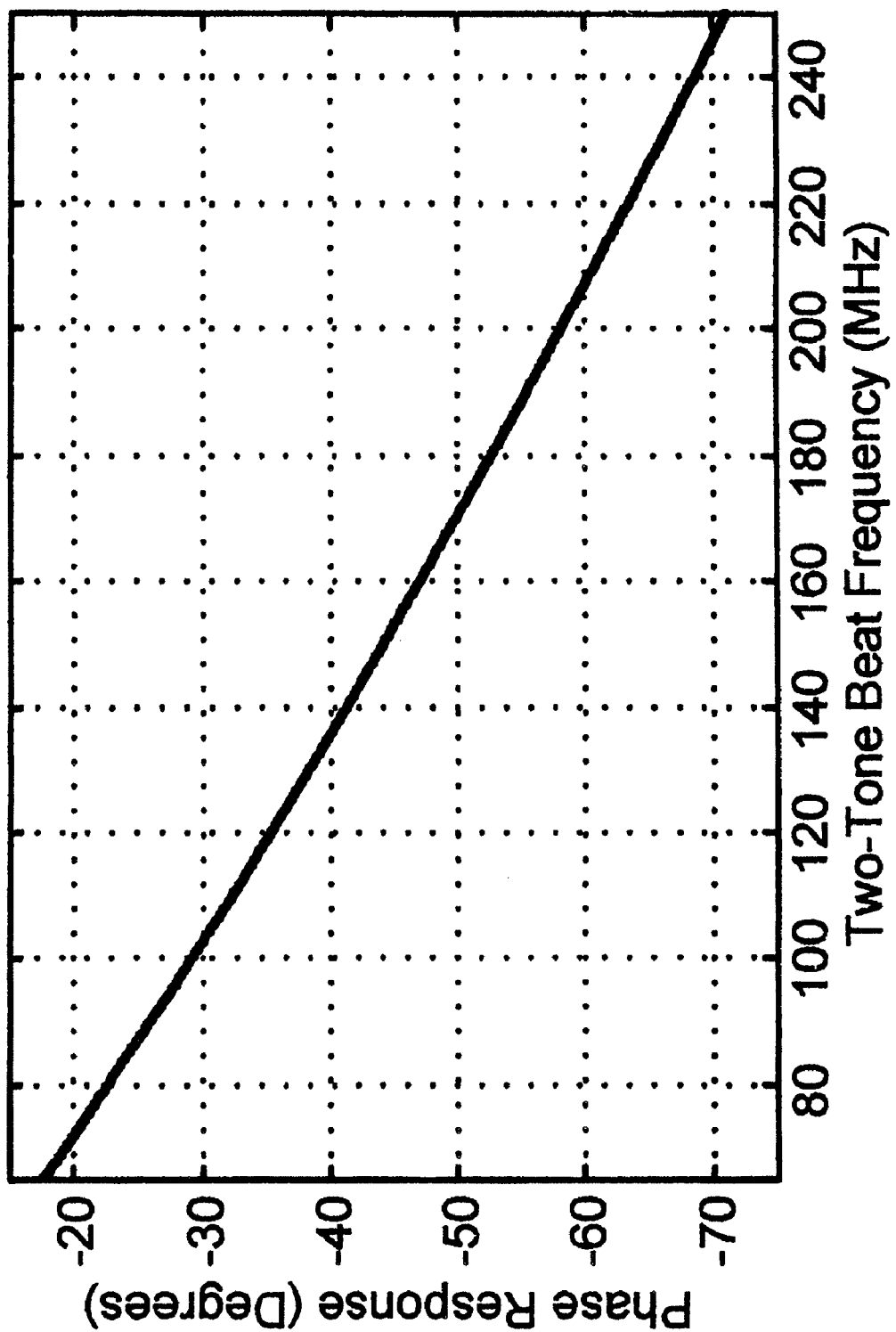
FIG. 12 shows a graph of a simulated phase response of a cubic circuit for a two-tone beat frequency.

The complex form of this algorithm is required for alternate path distortion cancellation, as the phase relationship between the main and alternate path signals is not fixed. To see why, consider the phase of the IM3 term generator as a function of the blocker two-tone beat frequency as shown in FIG. 12. As the beat frequency changes, the adaptive filter tracks the resultant rotational mismatch between the main and alternate paths. Note that for this reason the adaptive filter tap values can not be determined prior to the application of the IM3 producing blockers in such a way as to facilitate accelerated algorithm convergence.

With regard to fixed vs. adaptive equalization, adaptive equalization of a known path difference can be computationally inefficient. The main reason for this is twofold. First, most analog path differences are IIR in nature, while adaptive equalization algorithms such as those in the LMS family are FIR in nature. Secondly, even if the path difference were FIR, the LMS adaptive equalizer uses two multipliers per filter tap, as opposed to just one for a fixed FIR filter. Hence, the known difference between the main and alternate path transfer functions can be equalized by fixed real three-multiplier IIR filters, as shown in FIG. 4. The remaining path difference between the two paths is a complex DC gain and a small random mismatch in the baseband transfer function. This difference is broadband in the frequency domain and by the duality principle will correspond to a small number of taps required in the adaptive equalizer.

Turning now to compensating for I-Q mismatch in LMS-based adaptive equalizers, as can be seen from a one-tap implementation of EQ. 6, EQ. 7, and EQ. 8, for a solution to exist to the complex filter tap such that complete equalization is in theory achieved, the signals in the main and alternate paths should be related by a Givens rotation (EQ. 9):

$$\begin{bmatrix} m_I[n] \\ m_Q[n] \end{bmatrix} = \begin{bmatrix} w_I[n] & -w_Q[n] \\ w_Q[n] & w_I[n] \end{bmatrix} \begin{bmatrix} a_I[n] \\ a_Q[n] \end{bmatrix}$$
(9)

Figure 13A:
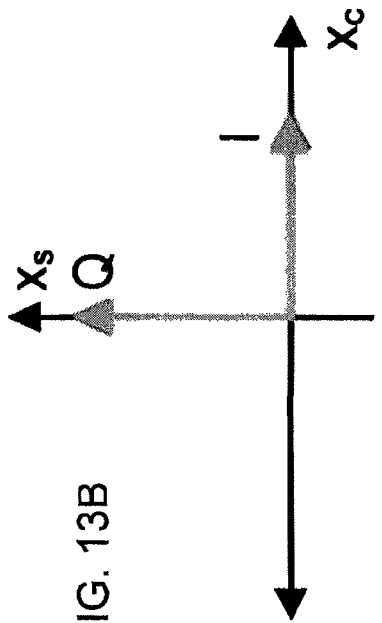
FIG. 13A shows a vector representation of IM3 products in the main and alternate paths.
Figure 13B:
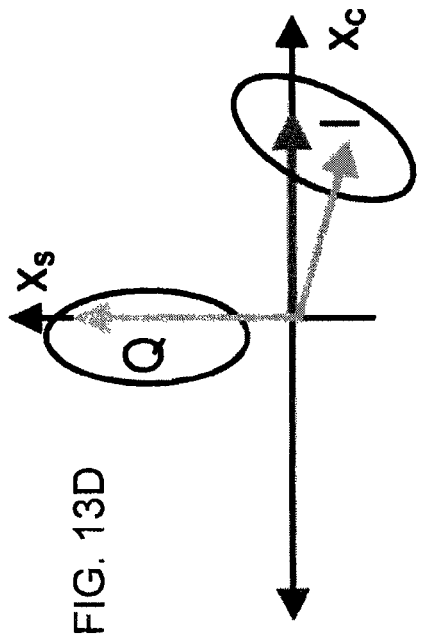
FIG. 13B shows a vector representation of IM3 products after the complex equalizer applies the proper Givens rotation to the alternate path signal.
Figure 13C:
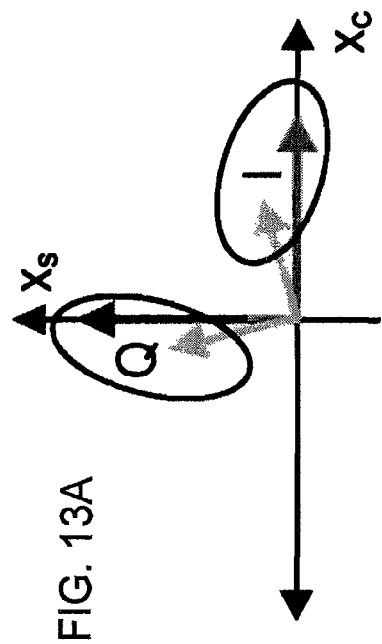
FIG. 13C shows a vector representation of IM3 products phase and rotational where a mismatch exists between the two paths and their respective signal vectors are not related by a Givens rotation.
Figure 13D:
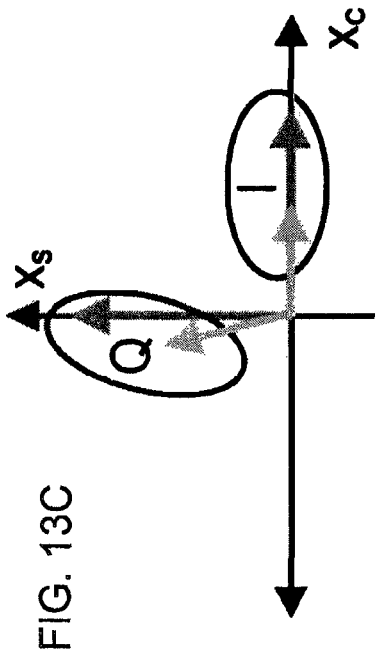
FIG. 13D shows a vector drawing illustrating the insufficiency of complex LMS/NLMS for an alternate and main path signal vector mismatch.
Figure 14:
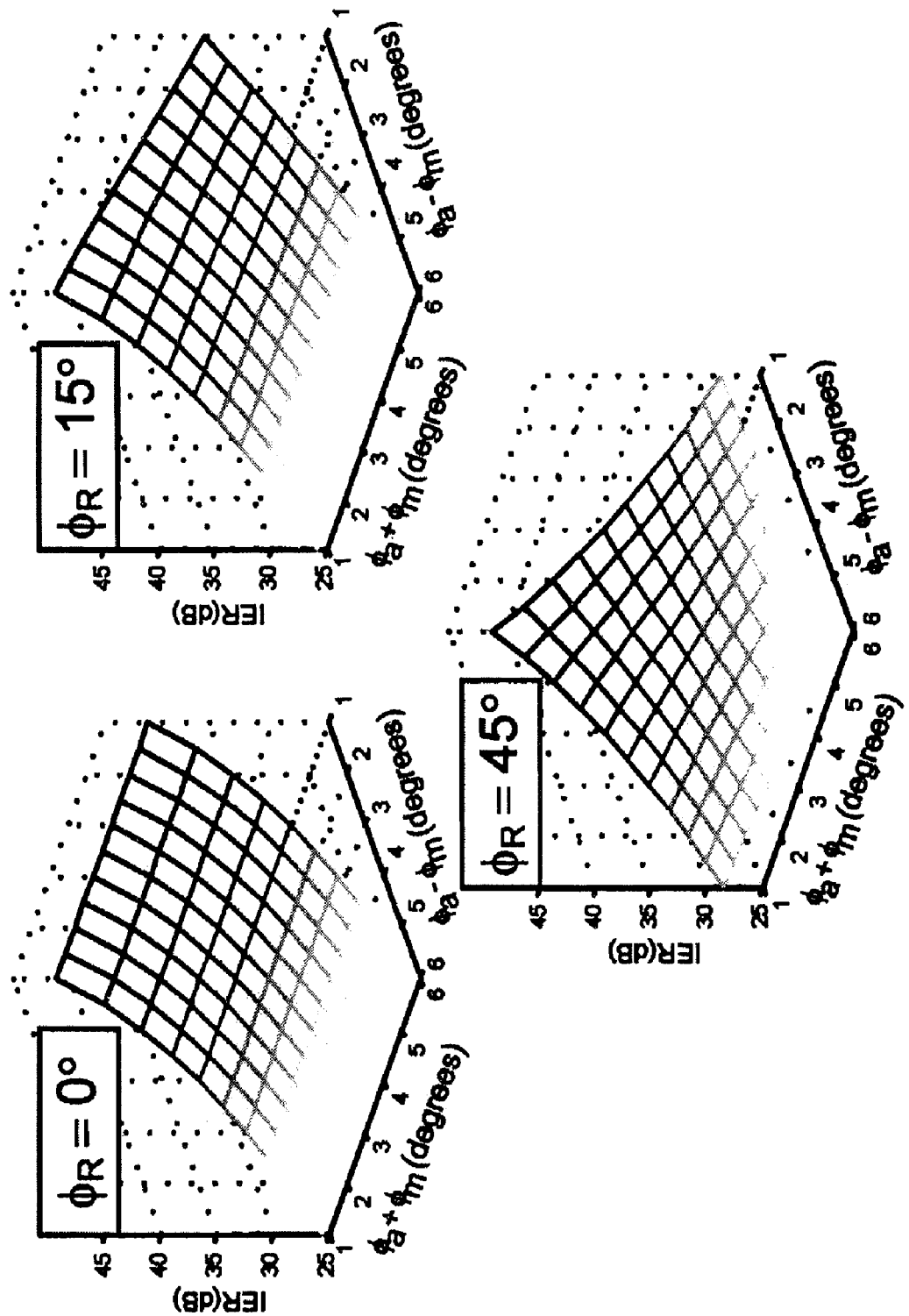
FIG. 14 shows graphs of IER vs. rotational mismatch and difference in phase mismatch for $\phi_R=0°$, $\phi_R=15°$, and $\phi_R=45°$.

This is the case in FIG. 13A which shows a vector representation of IM3 products in the main and alternate paths. After the complex equalizer applies the proper Givens rotation to the alternate path signal, subtraction yields complete cancellation, as in FIG. 13B. However, if as in FIG. 13C phase and rotational mismatch exist between the two paths, then it can be seen that their respective signal vectors are not related by a Givens rotation. In this case, complete cancellation cannot be achieved, limiting the effective IER of the alternate path. Using minimum mean squared error analysis, it can be shown that the IER due to this effect depends on not only the phase mismatch within the main and alternate paths, denoted $\phi_M$ and $\phi_A$ respectively, but also on the effective rotational phase mismatch $\phi_R$ between the main and alternate paths. Note that the nonconstant phase response of the cubic term generator shown in FIG. 12 contributes to $\phi_R$ and hence this value experiences significant change not only over process and temperature variation, but also over different blocker conditions. The actual IER expression is given in EQ. 10 for phase mismatch only and in EQ. 11 when DC gain mismatch exists as well. In EQ 11, $M_I$, $M_Q$, $A_I$, and $A_Q$ denote the baseband equivalent DC gains of the main and alternate I and Q channels. EQ. 10 is plotted in FIG. 14 for some representative values of the phase mismatches.

$$IER_{ALT}(dB) = -10 \log_{10}$$
$$\left[1 - \cos^2\left(\frac{1}{2}(\phi_A - \phi_M)\right)0\cos^2(\phi_R) - \cos^2\left(\frac{1}{2}(\phi_A + \phi_M)\right)\sin^2(\phi_R)\right]$$
(10)

$$IER_{ALT}(dB) =$$
(11)

$$-10 \log_{10}\left[1 - \frac{\left((M_I A_I + M_Q A_Q)\cos\left(\frac{1}{2}(\phi_A - \phi_M)\right)\cos(\phi_R) + (M_I A_I - M_Q A_Q)\sin\left(\frac{1}{2}(\phi_A - \phi_M)\right)\sin(\phi_R)\right)^2}{(A_I^2 + A_Q^2)(M_I^2 + M_Q^2)} - \frac{\left((M_I A_Q + M_Q A_I)\cos\left(\frac{1}{2}(\phi_A + \phi_M)\right)\sin(\phi_R) + (M_I A_Q - M_Q A_I)\sin\left(\frac{1}{2}(\phi_A + \phi_M)\right)\cos(\phi_R)\right)^2}{(A_I^2 + A_Q^2)(M_I^2 + M_Q^2)}\right]$$

It is evident that even in the absence of I-Q gain mismatch, small phase mismatches can severely limit the performance of the adaptive equalization. In order to overcome this constraint, an additional degree of freedom can be added to the adaptive algorithm. In the context of the Givens rotation, this means that EQ. 9 should change to EQ. 12:

$$\begin{bmatrix} m_I[n] \\ m_Q[n] \end{bmatrix} = \begin{bmatrix} w_I[n] & x_I[n] \\ w_Q[n] & x_Q[n] \end{bmatrix} \begin{bmatrix} a_I[n] \\ a_Q[n] \end{bmatrix}$$
(12)

In this case the new algorithm error subtraction equations become EQ. 13:

$$e_I[n] = m_I[n] - w_I^T[n]a_I[n] - x_I^T[n]a_Q[n]; \quad e_Q[n] = m_Q[n] - w_Q^T[n]a_I[n] - x_Q^T[n]a_Q[n]$$
(13)

Note that an equivalent solution to the I/Q mismatch problem in a complex adaptive equalizer has been suggested by Gerlach in "The Effect of I Q Mismatch Errors on Adaptive Cancellation" (IEEE Transactions on Aerospace and Electronic Systems, pp. 729-740, July 1992), and Gerlach et al. in "An Adaptive Matched Filter that Compensates for I, Q Mismatch Errors" (IEEE Transactions on Signal Processing, vol. 45, pp. 3104-3107, December 1997). Unlike the approach described by Gerlach, however, the equalizer tap update relations are developed herein by viewing the complex LMS algorithm as a completely real implementation and by substituting the EQ. 14 into EQ. 5. It can then be seen that EQ. 13 is satisfied and that EQ. 15 and EQ. 16 realize the tap update equations for the new algorithm:

$$e[n] = \begin{bmatrix} e_I[n] \\ e_Q[n] \end{bmatrix}; a[n] = \begin{bmatrix} a_I[n] \\ a_Q[n] \end{bmatrix};$$

$$m[n] = \begin{bmatrix} m_I[n] \\ m_Q[n] \end{bmatrix};$$

$$w[n] = \begin{bmatrix} [w_I[n] \ w_Q[n]]^T \\ [x_I[n] \ x_Q[n]]^T \end{bmatrix}$$

(14)

$$w_I[n+1] = w_I[n] + \tilde{\mu} e_I[n] a_I[n];$$
$$w_Q[n+1] = w_Q[n] + \tilde{\mu} e_Q[n] a_I[n]$$

and $$x_I[n+1] = x_I[n] + \tilde{\mu} e_I[n] a_Q[n];$$
$$x_Q[n+1] = x_Q[n] + \tilde{\mu} e_Q[n] a_Q[n]$$

(15)

(16)

Figure 15A:
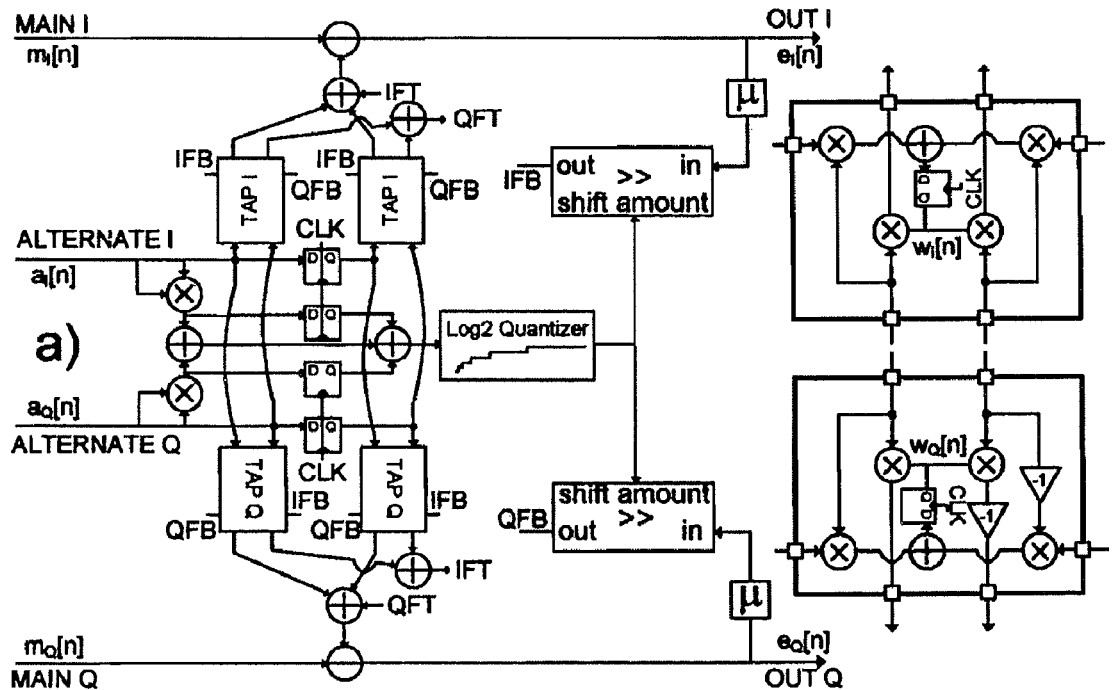
FIG. 15A shows a functional flow diagram for a hardware implementation of a canonical complex NLMS algorithm.
Figure 15B:
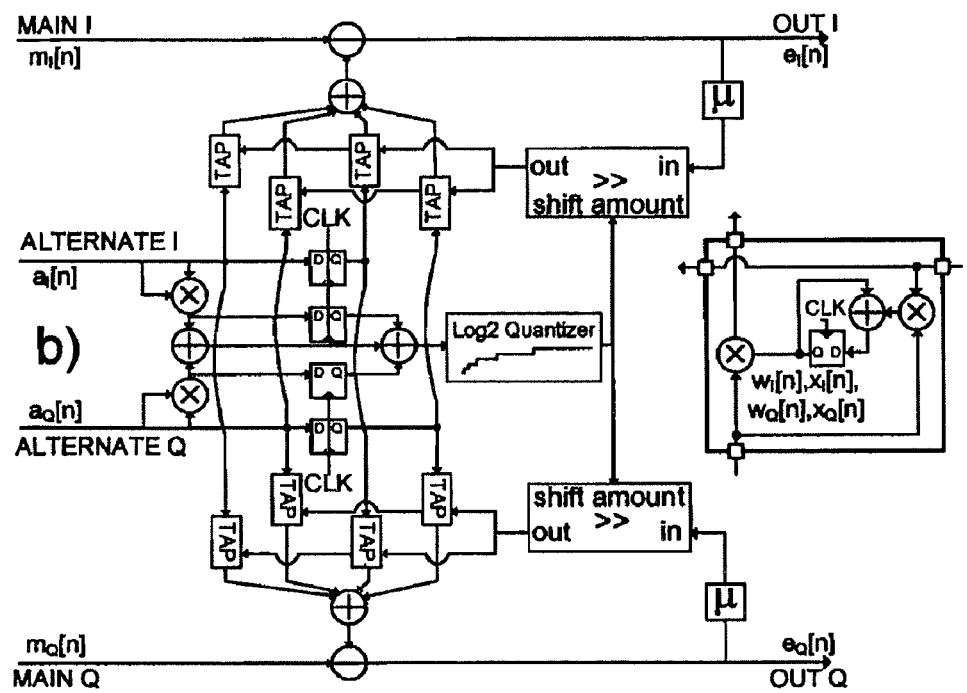
FIG. 15B shows a functional flow diagram for a hardware implementation of a complex NLMS algorithm with an enhanced degree of freedom.

As the new algorithm was obtained from the original via a vector substitution process, it follows from the results reported by Hassibi et al. in "H$^\infty$ optimality of the LMS algorithm" (IEEE Transactions on Signal Processing, vol. 44, pp. 267-280, February 1996) that it is H$^\infty$ optimal. As shown in FIG. 15A and FIG. 15B, this change is also efficient from a hardware perspective. Both the original NLMS and enhanced-degree-of-freedom NLMS equalizers have the same number of multipliers, which dominate the power and area consumption of the digital implementation.

FIG. 15B shows one exemplary version of the adaptive equalizer as implemented in hardware. Two doubly complex filter taps were used to adjust for a small path frequency response difference and for perturbations in the baseband group delay over variations in LO frequency. In practice these quantities typically also vary with process and temperature. The division associated with the NLMS algorithm is log 2-quantized here, allowing the use of a simple barrel shifter as a divider such as that reported by Oba, et al. in "FPGA Implementation of LMS and N-LMS Processor for Adaptive Array Applications" (International Symposium on Intelligent Signal Processing and Communications (ISPACS) Dig. Tech. Papers, pp. 485-488, December 2006).

Turning now to the operation of the alternate path in a non-static environment, we begin with a criterion for enabling and disabling the alternate path. In order to use the alternate path most efficiently, it should typically only be powered "ON" while IM3 products are corrupting the main path signal. A simple power detector at RF is generally unsuitable to detect this condition as such a circuit cannot discriminate between single and multiple blockers. Using a power detector at main path baseband can be similarly ineffective, as a power detector cannot discriminate between large IM3 products and large desired signal.

One method to detect a problematic blocking condition is to use a portion of the alternate path itself, as its baseband output power is proportional to the undesired IM3 products corrupting the main path signal. For example, the analog RF front end portion of the alternate path, typically including at least one odd-order nonlinear distortion reference generator, can be powered "ON" in the event that a problematic blocking condition is possible and its baseband output as monitored by a simple power detector circuit. Once an odd-order nonlinear distortion (e.g. IM3) power threshold is exceeded, the rest of the alternate path can then be enabled to perform IM3 cancellation. The present inventors also described an alternate path receiver power-up procedure in co-pending U.S. provisional patent Application Ser. No. 61/001,266.

The alternate path front end enable condition can be flagged by an additional power detection circuit at RF when blocker magnitudes exceed a certain threshold or, as in UMTS, when the TX output power is known to exceed a certain threshold. Based on measured results in this receiver, IM3 products large enough to corrupt the desired signal may arise when the TX output power is greater than +10 dBm. According to Schwab, et al. in "Analysis of Mobile-Originated Interference in Coexisting UMTS Networks" (Vehicular Technology Conference, 2002, Vol. 4, pp. 1636-1639, May 2002) in UMTS this condition occurs 30% of the time in a cell with radius of 1 km and 20 users. Thus, the time-averaged power consumption of the RF front-end portion of the alternate path would be reduced by this amount under these conditions. The time-averaged power consumption of the rest of the alternate path would be negligible, as its operation depends on the rare event when another blocker appears with the proper amplitude and frequency so as to cause IM3 products.

Using detection procedures as described above, the possibility of a false alarm and the effects of false alarms on the system can be considered. If a false alarm were to occur with the systems as described above, both the main and alternate path inputs to the adaptive equalizer would consist of uncorrelated noise-like signals. Since there is no significant correlated data in the main and alternate paths, the equalizer taps will not converge but will exhibit a small variation around the zero value. This noisy signal then multiplies the thermal noise in the alternate path. However, since both signals are small, the resultant noise signal added to the main path is also typically small, resulting in a negligible increase in the receiver noise figure.

Powering "OFF" the alternate path can be done with a modified SNR detection procedure within the adaptive equalizer. The IM3 content of the main path can be estimated by considering the total summed signal power at the output of the equalizer taps. Comparing this quantity to the total power of the equalizer output yields an estimate of the desired signal to IM3 product ratio. When this ratio is high enough, the baseband portion of the alternate path can be turned "OFF". Because the SNR estimate can fluctuate under fading conditions, a minimum "ON"-time can be instituted for the alternate path baseband circuitry such that it does not toggle on and off repeatedly within a single blocking incident.

We turn now to DC offset issues during alternate path enabling. As is well-known, direct conversion receivers are susceptible to large DC offsets at baseband. DC offset presents an issue with regards to the adaptive filter in that if both DC offset and IM3 signal are present on both main and alternate paths, the adaptive equalizer will attempt to equalize both signals. However, because the DC offset is large and uncorrelated with the path mismatch at DC, the optimal transfer function of the adaptive equalizer will have a large impulse at DC in the frequency domain. In the time domain, a large impulse at DC corresponds to a very large number of adaptive filter taps, which as reported by Haykin can consume inordinate amounts of power and degrade the performance of the equalizer.

One common solution to the DC offset issue in UMTS receivers is to use high-pass filtering at baseband, typically with a cutoff frequency no greater than 10 kHz as suggested by Rogin, et al. in "A 1.5-V 45-mW Direct-Conversion WCDMA Receiver IC in 0.13-μm CMOS" (IEEE Journal of Solid-State Circuits, vol. 38, pp. 2239-2248, December 2003). In some embodiments, high-pass filtering at 10 kHz is performed in the digital domain for both main and alternate paths to remove the DC offset of the complete analog portion of the receiver, including the ADC. The problem with high-pass filtering alone in either domain, however, is that when the alternate path powers "ON", the DC offset of the mixer appears as a step to the alternate path high pass filter. Because the cutoff frequency of the HPF is low, the resultant step response takes 3-4 time constants to settle below the error floor, thus preventing convergence of the adaptive filter during this time.

Another option is to adaptively remove DC offset as part of the equalizer algorithm as has been reported by Faulkner, "DC Offset and IM2 Removal in Direct Conversion Receivers," (IEE Proceedings Communications, vol. 149, pp. 179-184, June, 2002) and Der, et al. in "A 2-GHz CMOS Image-Reject Receiver With LMS Calibration," (IEEE Journal of Solid-State Circuits, vol. 38, pp. 167-175, February 2003). However, it can be shown that this technique effectively implements a high-pass filter and would typically have the same settling time issue.

Figure 16:
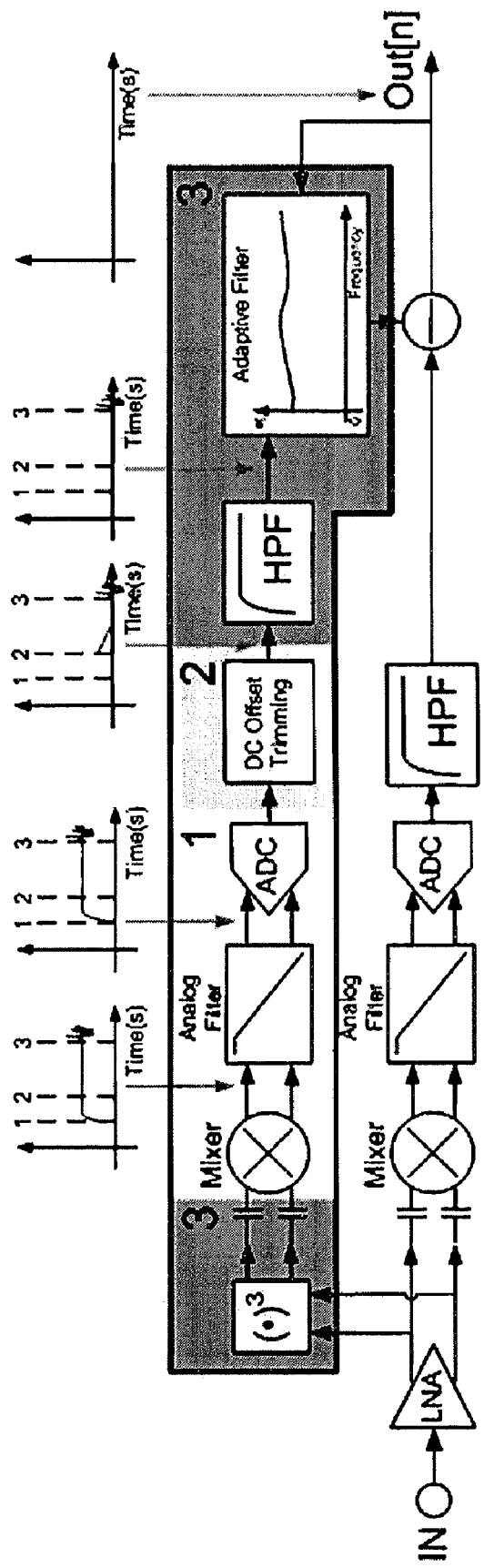
FIG. 16 shows a block diagram of an alternate path receiver having a DC offset correction.

In some embodiments, where the high-pass filters mentioned above are retained, the alternate path baseband circuitry, or at least part of the alternate path baseband circuitry, can be powered "ON" to measure the DC offset in the digital domain in the absence of IM3 products being passed through the alternate path. The DC offset measurement can then be subtracted from the incoming signal to remove the DC offset. Since the only signals present at this time are DC offset and a small amount of noise, these operations can be performed relatively quickly (a few μs) by a simple averaging circuit, permitting periodic DC offset measurements while the alternate path front end is enabled for IM3 product detection. The complete scheme is depicted in FIG. 16. DC offset correction can be performed in the main path as well.

Regarding the behavior of the system in a fading environment, the adaptive equalizer in the architecture presented herein exists mainly to compensate for unknown circuit mismatches and the effective rotational phase difference between the main and alternate paths. However, the adaptive equalizer can also be used to track slightly to compensate for changing blocker characteristics as a result of fading. Considering that most IM3-producing blockers for UMTS are clustered around 2 GHz, and assuming that the maximum speed of the mobile terminal is 250 km/h, the minimum coherence time of the blockers as reported by Springer, et al. in "UMTS: The Physical Layer of the Universal Mobile Telecommunications System" (Springer-Verlag, Berlin: 2002, pp. 34-40) is about 400 μs. Typically, the adaptive equalizer should be able to converge faster than this amount in order to properly track the changing IM3 products.

Figure 17:
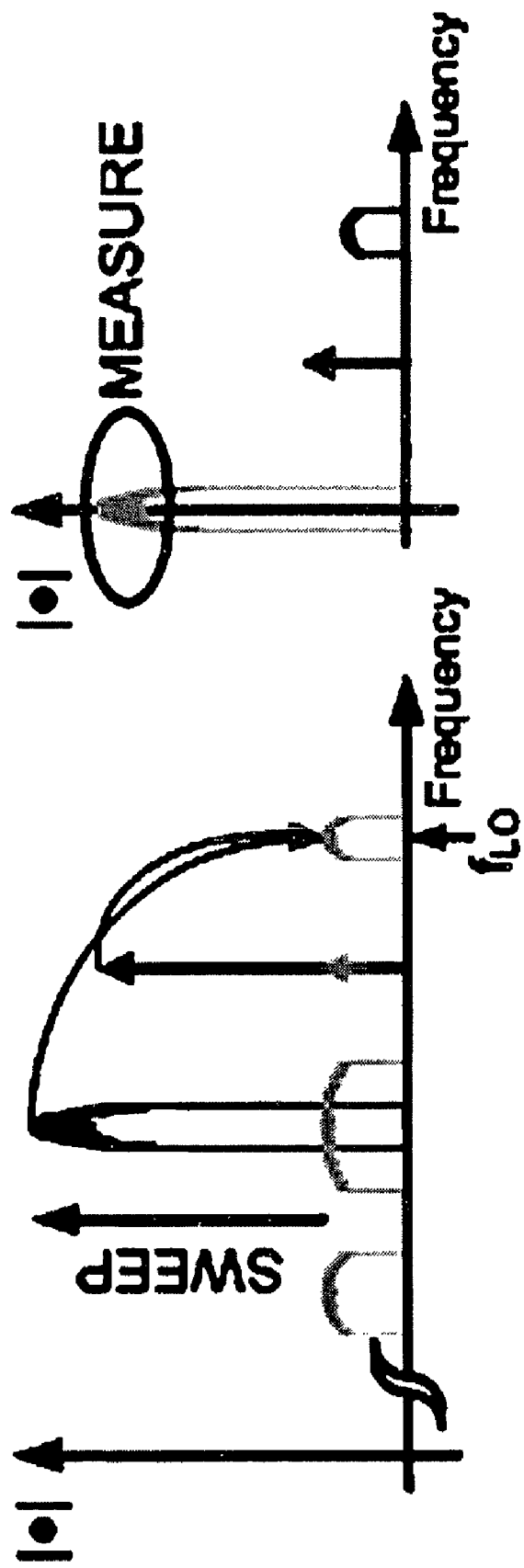
FIG. 17 shows two frequency domain graphs depicting a two-tone test concept.

We turn now to experimental receiver IIP3 measurement results. FIG. 17 shows the concept behind a modified two-tone IIP3 test used to evaluate the IM3 equalization. The goal was to reproduce the TX leakage and CW blocker signals at the LNA input at several magnitudes (including the worst-case specified), at all 12 UMTS RX frequencies and to measure the output across the RX band in each instance. The TX signal model was a QPSK-modulated pseudorandom noise bit sequence (PN23) at 3.84 MSPS that was upsampled, passed through the UMTS-specified channel filter, and upconverted to 1.98 GHz. The CW magnitude was fixed at 8 dB less than that of the TX.

Figures 18A, 18B:
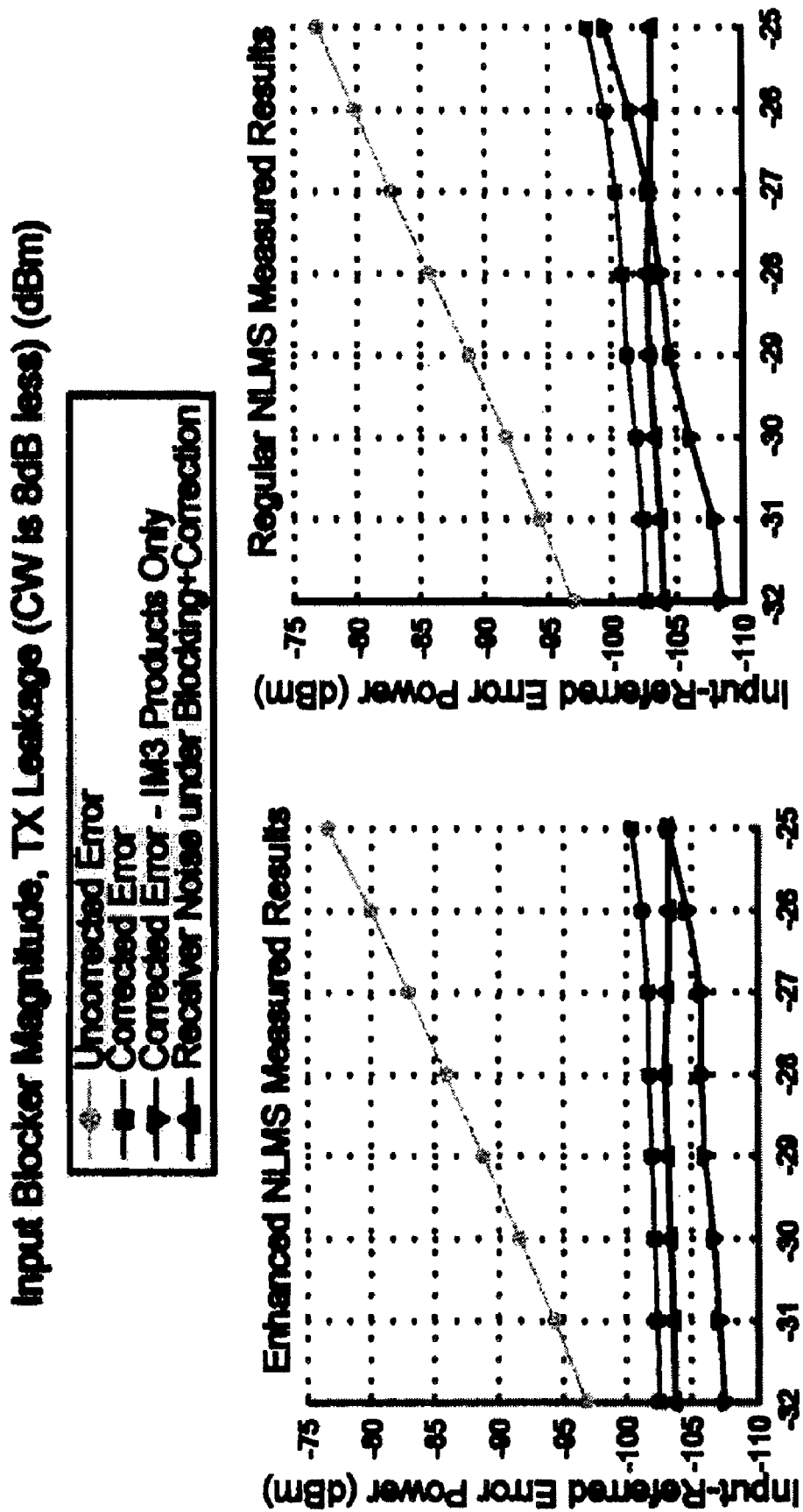
FIG. 18A shows a graph of an enhanced NLMS measured two tone test result.
FIG. 18B shows a graph of a regular NLMS measured two tone test result.

FIG. 18A and FIG. 18B show graphs depicting two-tone measurement test results for an enhanced complex NLMS architecture (FIG. 18A) and for a canonical complex NLMS architecture (FIG. 18B). FIG. 18A shows enhanced NLMS measured results as the resultant steady-state error over swept TX leakage magnitude for $f_{LO}$=2.1225 GHz. Note that all plots shown and numbers reported depict the I/Q receiver channel with worst-case performance under worst-case specified blocking. The total input-referred error accounts for gain loss, thermal noise, and all IM products. Removing the effects of main path thermal noise and IM2 products yields a lumped input-referred error quantity consisting of all other error sources. From this quantity, which was treated as residual IM3 error, a slope-of-3 line was extrapolated from the worst-case input blocker magnitude to obtain an effective IIP3 metric. Other measurement results show that the corrected IIP3 performance was limited by higher-order distortion products in the main path. Note that 50Ω kTB noise is removed from these plots and that the maximum total input-referred error in this regard, computed hereinabove (−98.2 dB) under the worst-case scenario of −26 dBm TX leakage, is met with 3 dB of margin when correction is applied. The contribution of the baseband circuitry to the uncorrected IIP3 has also been measured and found to be negligible. FIG. 18B shows the results of this same test using the NLMS algorithm without the enhanced degree of freedom. A phase mismatch of about 3° in the main path along with mismatch in the baseband frequency responses, are responsible for the higher input-referred IM3 products. This confirms experimentally that the NLMS algorithm enhancement produces a noticeable performance improvement.

Figure 19:
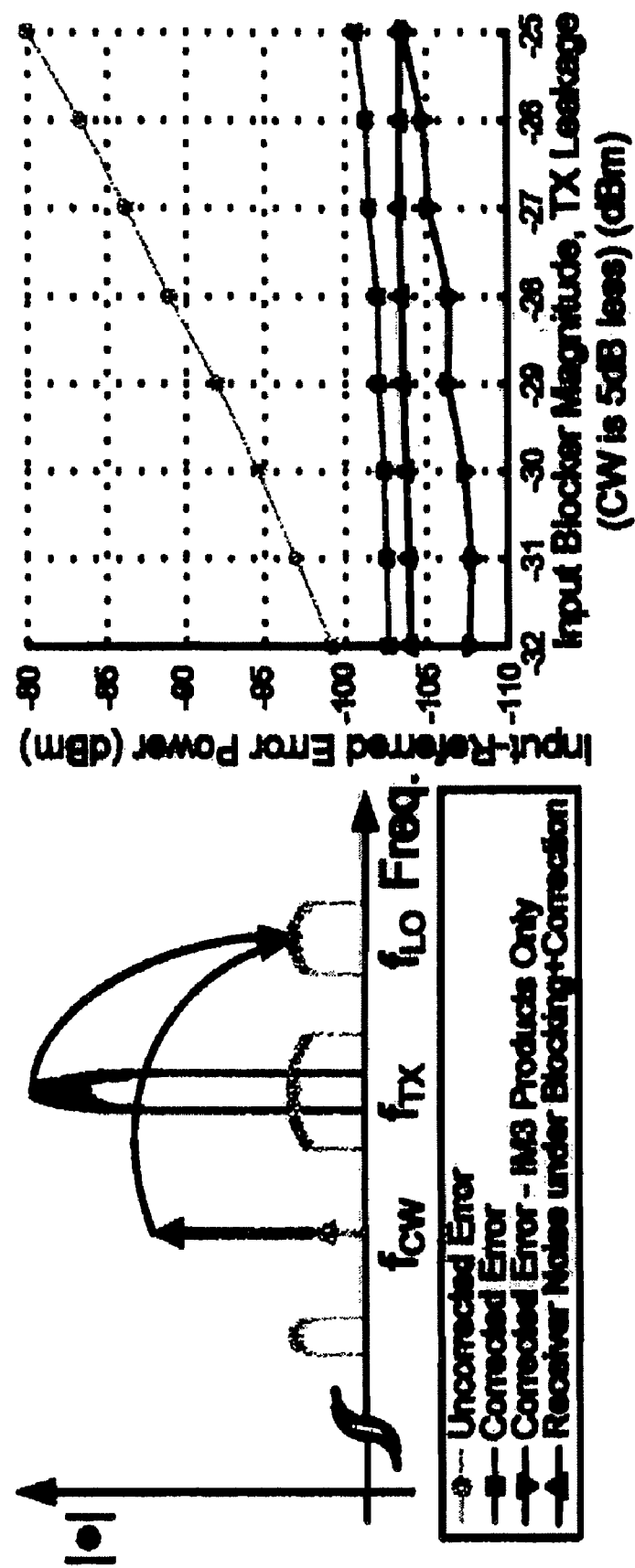
FIG. 19 shows two graphs depicting test results for a modified two-tone measurement.

Although the uncorrected IIP3 of the receiver happens to be sufficient to handle the scenario in which the CW blocker frequency is less than the TX frequency, the CW blocker amplitude was exaggerated far above specification in order to show that this case is covered by the proposed architecture as well. This case generates an IM3 product consisting of a frequency-translated version of the squared modulated TX signal in the main path. It is worthwhile to measure these results, as this condition is subject to an additional error term resulting from the bandlimited nature of the cubic term generator. Specifically, the alternate path output is not squared TX leakage but rather the modulated TX leakage multiplied by a delayed version of itself. FIG. 19 shows the results of this test which has similar correction ratios to those seen in FIG. 18A.

Figure 20:
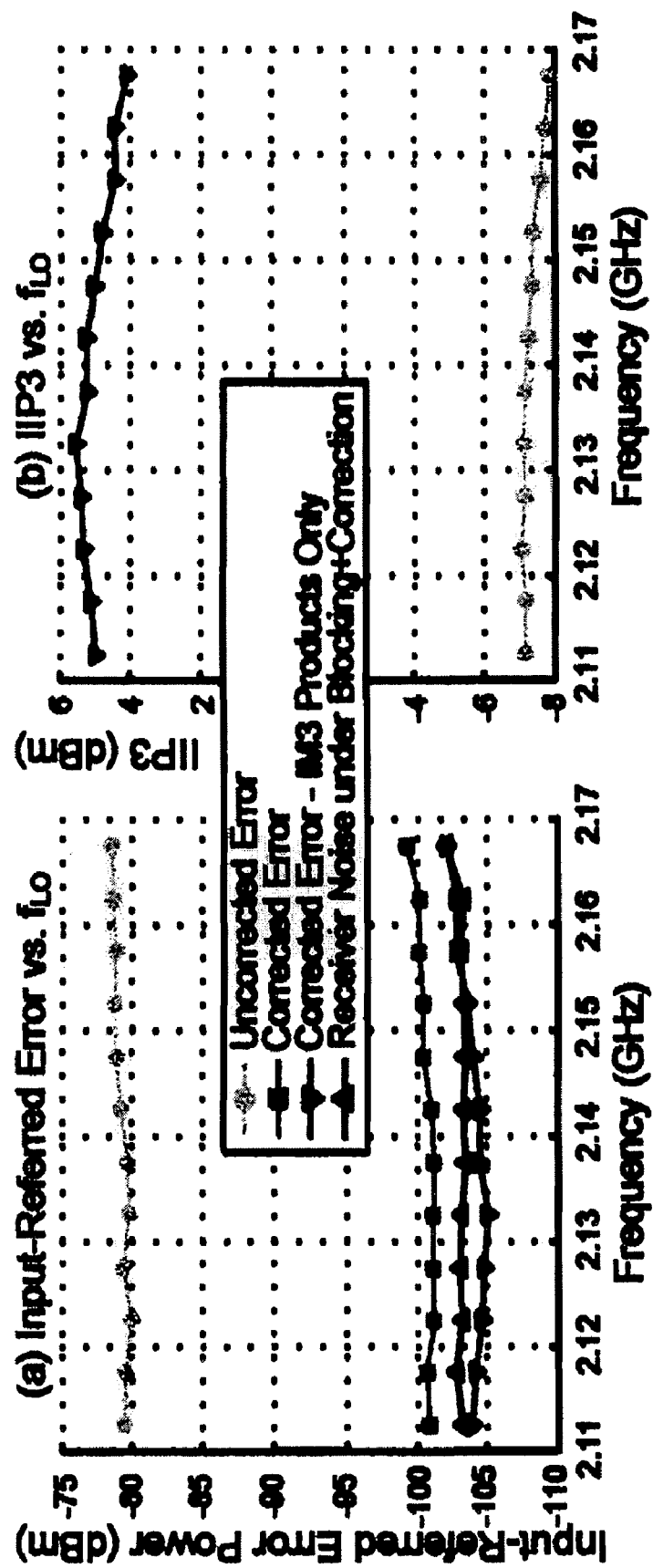
FIG. 20 shows two graphs depicting test results for a modified two-tone measurement for −26 dBm TX leakage, and a −34 dBm CW blocker swept over the LO frequency.
Figure 21:
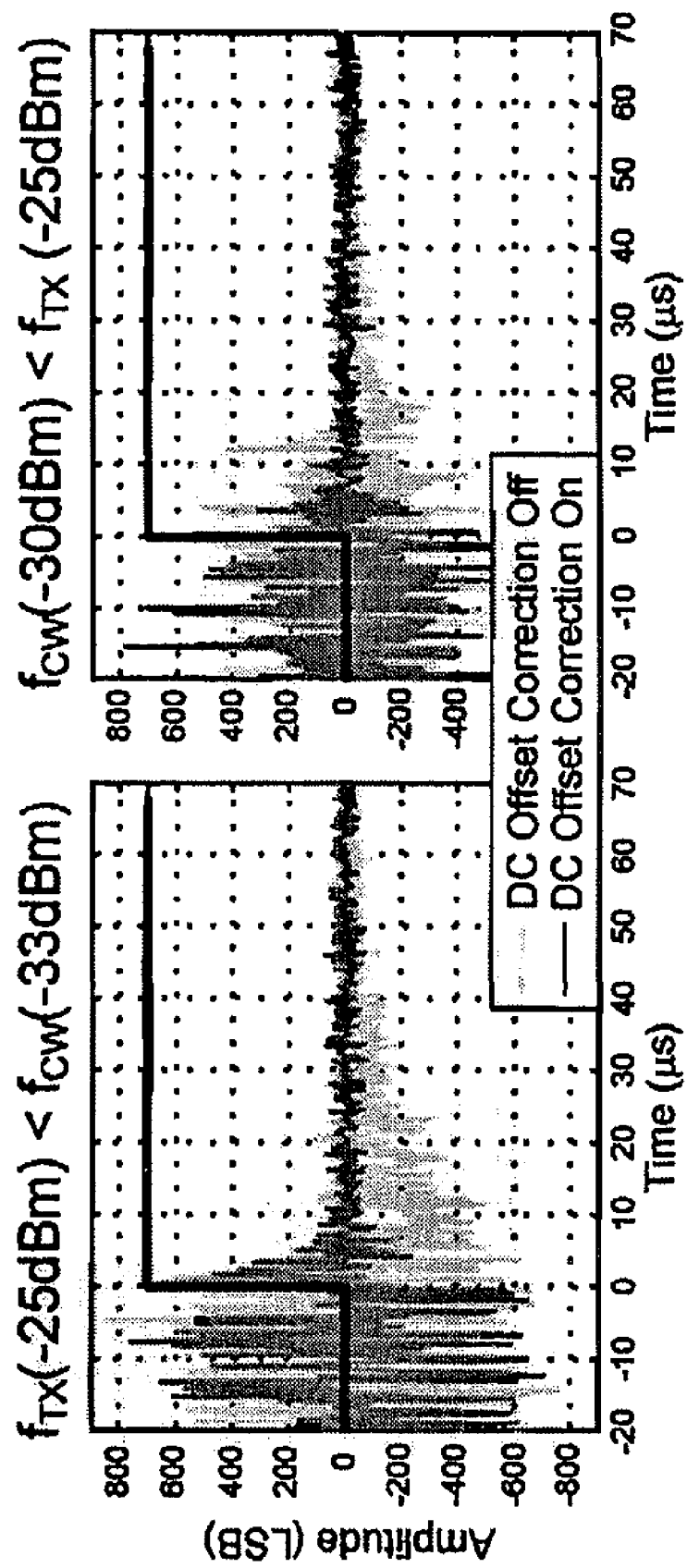
FIG. 21 shows two graphs illustrating the measured convergence behavior in time of an exemplary adaptive equalization algorithm.
Figure 22:
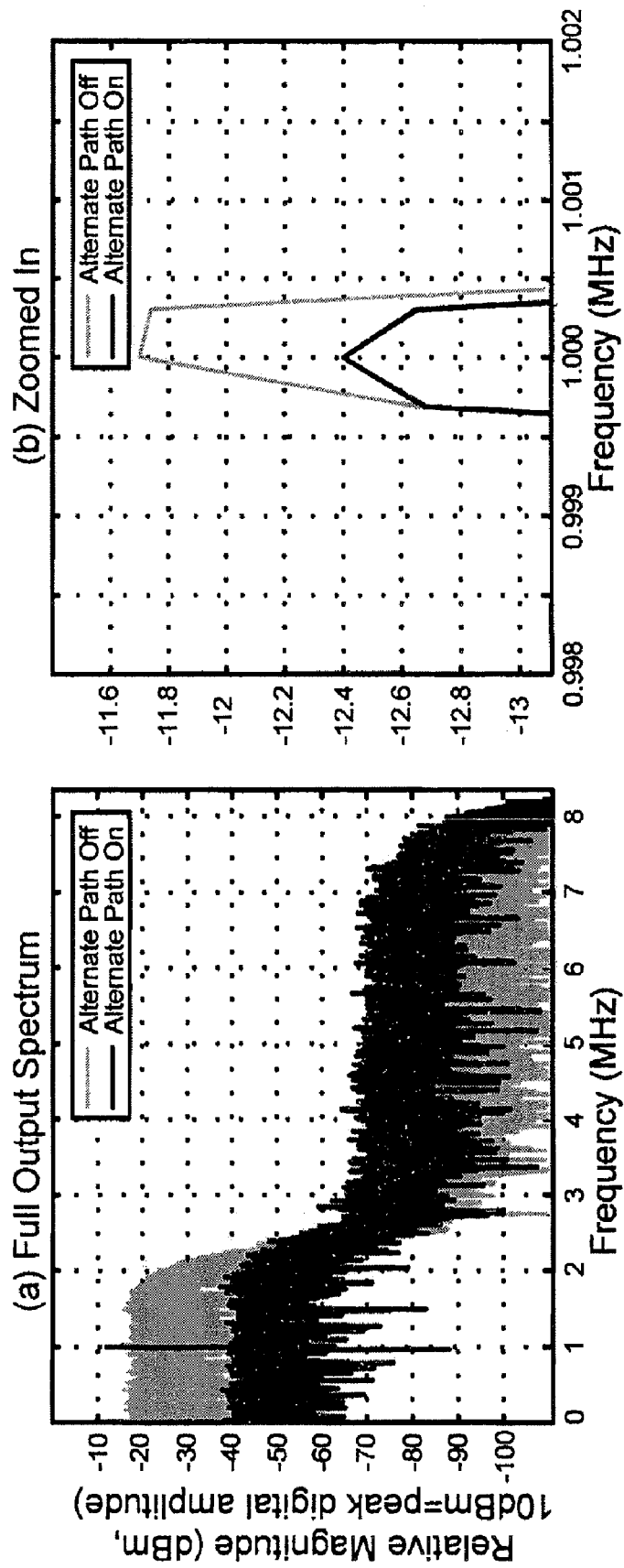
FIG. 22 shows a spectrum analyzer graphs illustrating the corrected (alternate path "ON") and uncorrected (alternate path "OFF") spectrums in the presence of modulated IM3 products and a desired tonal signal over a full scale and for a magnified frequency scale.

FIG. 20 shows the results of the experiment performed for FIG. 18A as repeated across the UMTS RX band. The TX frequency was kept at 1.98 GHz and the CW frequency adjusted so that the IM3 products landed within the RX band. Convergence behavior of the adaptive equalizer is shown in FIG. 21 for the case where $f_{LO}$=2.1225 GHz. It is seen that if DC offset correction is not applied prior to the enabling of the alternate path digital back end, the convergence time is dramatically extended, as expected. The frequency-domain measurement of the digital receiver output in the presence of a moderately large tonal desired signal is shown in FIG. 22 both with and without correction.

Figure 23:
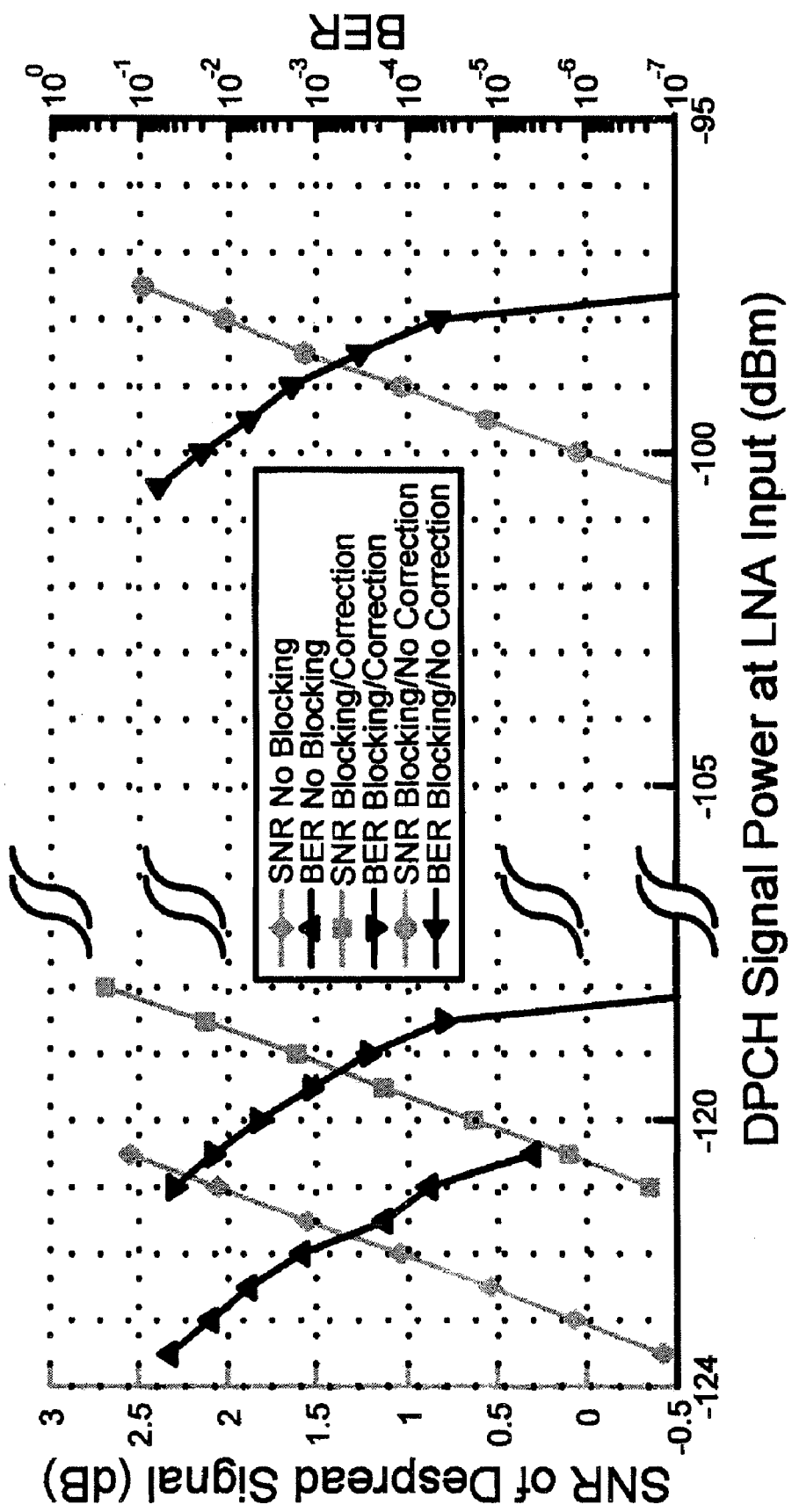
FIG. 23 shows a graph of SNR vs. DPCH signal power for various exemplary blocking signal and correction scenarios.

Now turning to receiver sensitivity measurement, the actual specification to be met for UMTS is that of the sensitivity test, which has been inferred from input-referred error tests by the relations as described by Reynolds, et al. in "Design and Compliance Testing of a SiGe WCDMA Receiver IC with Integrated Analog Baseband" (Proceedings of the IEEE, vol. 93, pp. 1624-1636, September 2005), Minnis et al. in "A Highly Digitized Multimode Receiver Architecture for 3G Mobiles" IEEE Transactions on Vehicular Technology, vol. 52, pp. 637-653, May 2003), and Springer, et al. in "UMTS: The Physical Layer of the Universal Mobile Telecommunications System" (Springer-Verlag, Berlin, 2002, pp. 34-40). With $L_{DUP}$=1.8 dB the receiver must achieve BER=$10^{-3}$ for DPCH_Ec=−118.8 dBm at the LNA input under typical conditions and DPCH_Ec=−115.8 dBm under blocking. FIG. 23 shows the results of such a test using an exemplary receiver as described herein at $f_{LO}$=2.1225 GHz with both I and Q channels active. FIG. 23 shows a graph of measured receiver DPCH SNR and BER under sensitivity, sensitivity/blocking/correction and sensitivity/blocking/no correction respectively. The input used was a specification-equivalent UMTS 12.2 kbps downlink reference measurement channel, and the measurement results obtained were comparable to those reported by Reynolds. Each point in FIG. 23 represents the average of $4.88 \times 10^5$ bits (2000 data frames), which is sufficient to accurately resolve BER down to $10^{-4}$. The baseline sensitivity is −121.9 dBm, 0.5 dB greater than predicted by the measured noise figure, with the discrepancy accounted for by unfiltered noise at frequencies greater than 1.92 MHz. The sensitivity of the receiver under worst-case blocking and correction is −119.5 dBm, 0.9 dB greater than predicted by total input-referred error, with 0.6 dB of this difference accounted for by noise at frequencies greater than 1.92 MHz. This shows that the total input-referred corrected error curve from FIG. 20 is an accurate predictor of the actual sensitivity performance. Without correction, sensitivity significantly exceeds specification at −98.8 dBm under blocking.

Figure 24:
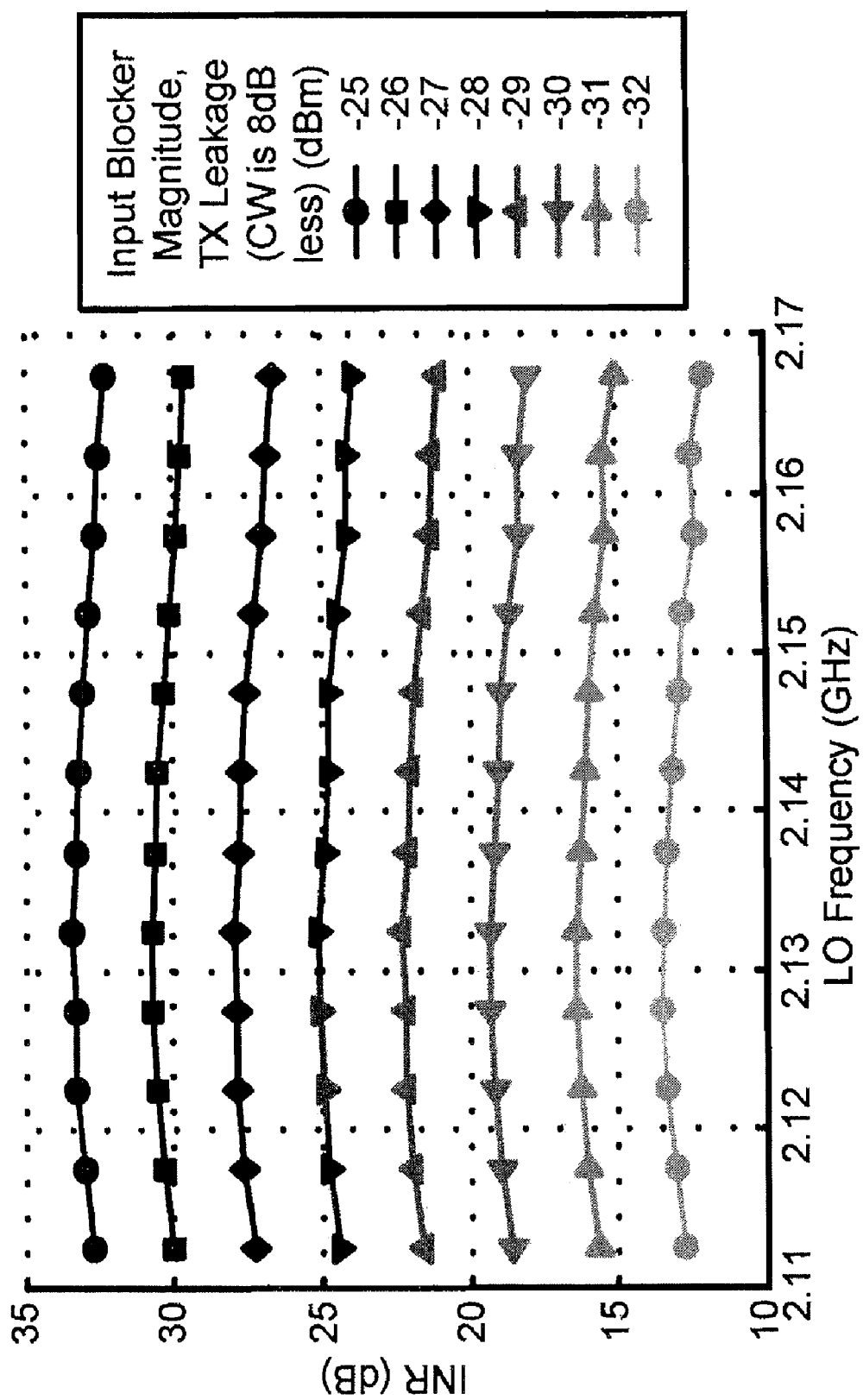
FIG. 24 shows a graph of measured INR performance of an exemplary alternate path.

Regarding alternate path measurement results, the IM3-to-noise ratio (INR) performance of the alternate path was measured up to the equalizer input and shown in FIG. 24. Performance under worst-case specified blocking conditions at $f_{LO}$=2.1225 GHz is 31 dB. Additional measurements suggest that higher order distortion products lower IER from INR by less than 1 dB. Alternate path linear term feedthrough was also measured and referred to the main path input. The attenuation referred to the main path input is found to be greater than 46 dB over all LO frequencies, indicating that the effect of these terms in the equalization process is negligible.

Figure 25:
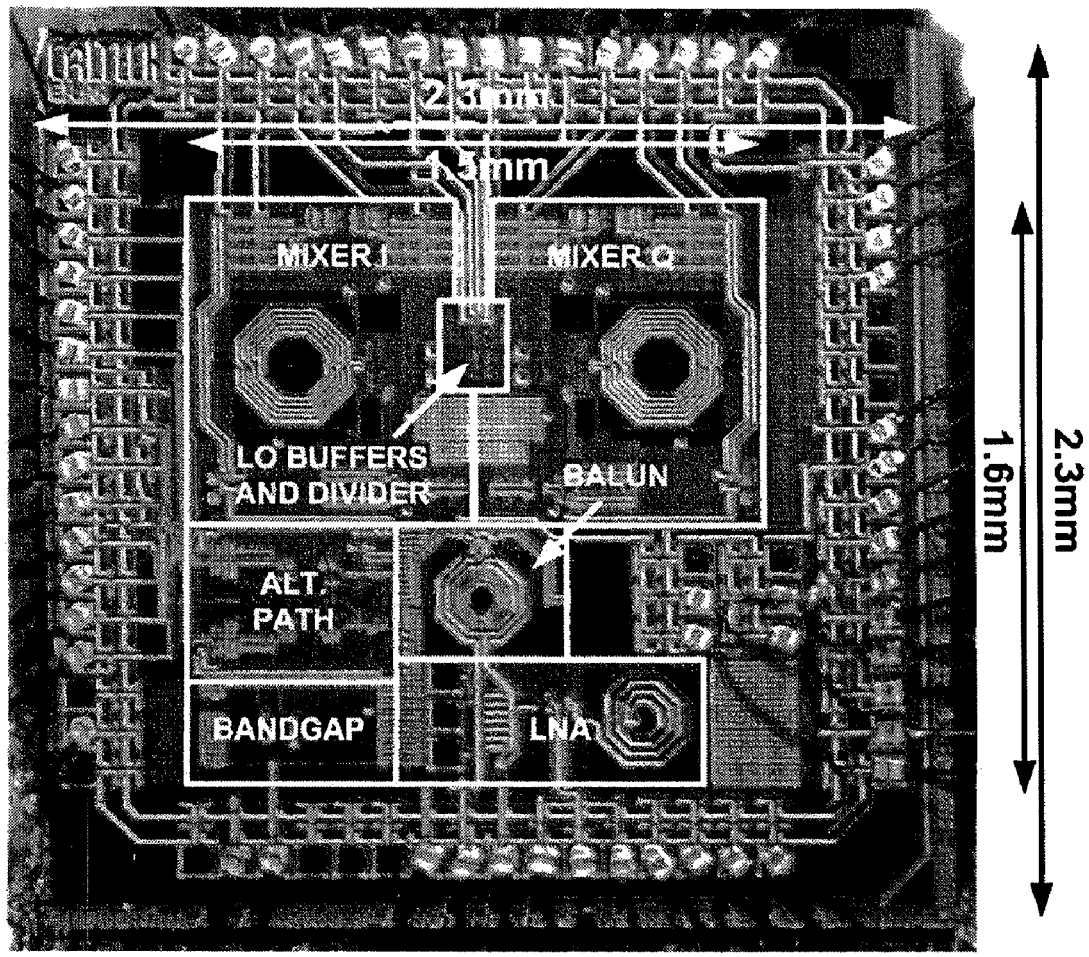
FIG. 25 shows a die photo of one embodiment of a RF front end.

FIG. 25 shows a photo of the exemplary RF front end die. The performance summary for the system and front end is shown in the following table:

| Parameter Measured At $f_{LO}$ = 2.1225 GHz | Result |
| --- | --- |
| Active Analog Die Area | 1.6 mm × 1.5 mm |
| Active Analog Die Alternate Path Area | 0.5 mm × 0.4 mm |
| Analog Die Technology Node | 130 nm RF CMOS |
| Analog Die Supply Voltage | 1.2 V/2.7 V |
| Estimated Alternate Path Digital Die Area | 0.42 mm × 0.42 mm |
| Digital Die Technology Node | 90 nm Bulk CMOS |
| Digital Die Supply Voltage | 1.0 V |
| Analog Die LNA + Main Path Current | 28 mA (1.2 V) |
| Analog Die Alternate Path Current | 6.7 mA (1.2 V) |
| Estimated Digital Alternate Path Current | 5.6 mA (1.0 V) |
| Analog Die LNA + Main Path DC Gain | 30.5 dB |
| Complete Main Path System DC Gain | 70.2 dB |
| Input Return Loss (S11) 2.11 GHz-2.17 GHz | <−13 dB |
| IIP2@1.98 GHz | +58 dBm |
| Uncorrected IIP3 @ 1.98 GHz/2.05125 GHz | −7.1 dBm |
| Effective IIP3 @ 1.98 GHz/2.05125 GHz | +5.3 dBm |
| ICP1@1.98 GHz | −19 dBm |
| Analog Die LNA + Main Path NF | 5.1 dB |
| Complete System NF | 5.5 dB |
| Baseline DPCH Sensitivity | −121.9 dBm |
| DPCH Sensitivity Under Blocking/Correction Off | −98.8 dBm |
| DPCH Sensitivity Under Blocking/Correction On | −119.5 dBm |
| Baseband Signal Measurement Bandwidth | 10 kHz-1.92 MHz |

Note that some of these measurements and other quoted results differ from those previously reported by two of the inventors of the present invention, E. Keehr and A. Hajimiri, in "Equalization of IM3 Products in Wideband Direct-Conversion Receivers" (IEEE International Solid-State Circuits Conference (ISSCC) Dig. Tech. Papers, pp. 204-205, February 2008) due to improvements made to the system to permit acceptable operation across the entire RX band. The new power consumption estimate of the alternate path digital back end circuitry was obtained from switching statistics of a gate-level Verilog simulation referencing a 90 nm CMOS process standard cell library.

Many functions of electrical and electronic apparatus can be implemented in hardware (for example, hard-wired logic or other circuitry), in software (for example, using instructions encoded in a program operating on a general purpose processor or on a specially designed processor), and in firmware (for example, using instructions encoded in a non-volatile memory that is accessed for operation on a processor as required). The present invention contemplates the substitution of one implementation of hardware, firmware and/or software for another implementation of the equivalent functionality using a different one of hardware, firmware and/or software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and/or software implementations of portions or segments of the transfer function, is contemplated herein.

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A feedforward error-compensated receiver for minimizing undesired odd-order nonlinear distortion products comprising:

a first receiver path having a first path input configured to receive an input signal having at least one non-baseband frequency, and at least one first path output configured to provide a first path output signal having at least one baseband (BB) frequency, said first receiver path comprising at least one mixer, said at least one mixer having a first input terminal electrically coupled to a local oscillator configured to provide a local oscillator signal and having a second input terminal electrically coupled to said first path input and having a mixer output terminal electrically coupled to said at least one first path output, said mixer configured to perform a frequency conversion, said first path output signal comprising an odd-order nonlinear distortion component;

at least one second receiver path having a second path input configured to receive an input signal having at least one non-baseband frequency, and a second receiver path output terminal configured to provide a second receiver path output signal, said second receiver path comprising at least one odd-order nonlinear distortion reference generator having an output terminal, said second receiver path comprising at least one mixer, each of said at least one mixer having a first input terminal electrically coupled to a local oscillator configured to provide a local oscillator signal and having a second input terminal electrically coupled to said at least one odd-order nonlinear distortion reference generator output terminal and having a mixer output terminal electrically coupled to said at least one second path output, said at least one odd-order nonlinear distortion reference generator and said mixer configured to generate a synthetic odd-order nonlinear distortion signal as output that is substantially similar to said odd-order nonlinear distortion component that appears at said first path output terminal; and a combining element configured to receive said output signal from said first path output terminal and configured to receive said output signal from said second receiver path output terminal and configured to combine said input signals such that the odd-order nonlinear distortion signals are substantially attenuated at an output of said combining element.

2. The feedforward error-compensated receiver of claim 1, wherein said non-baseband frequency is a selected one of a radio frequency (RF) and an intermediate frequency (IF).

3. The feedforward error-compensated receiver of claim 1, wherein said baseband frequency comprises a low intermediate band frequency.

4. The feedforward error-compensated receiver of claim 1, wherein said combining element is configured to use adaptive coupling.

5. The feedforward error-compensated receiver of claim 1, wherein said combining element comprises at least one adaptive equalizer having first and second adaptive equalizer inputs electrically coupled respectively to one of said first path output terminal and a second receiver path output terminal, and having at least one adaptive equalizer output configured to provide an adaptive feedforward error-compensated receiver output signal, said adaptive equalizer including an adaptive filter, said adaptive equalizer configured to automatically adjust a set of adaptive filter coefficients based on a correlation estimate between said adaptive equalizer output and said second receiver path output signal so as to reduce said second receiver path output signal content in said adaptive equalizer output to minimize undesired odd-order distortion products in said adaptive feedforward error-compensated receiver output signal.

6. The feedforward error-compensated receiver of claim 1, wherein said first path comprises a baseband filter configured to attenuate high-frequency signals.

7. The feedforward error-compensated receiver of claim 1, wherein said at least one second receiver path comprises a baseband filter configured to attenuate undesired out of band frequencies.

8. The feedforward error-compensated receiver of claim 1, wherein said undesired out of band frequencies include high-frequency odd-order distortion products.

9. The feedforward error-compensated receiver of claim 1, further comprising a low noise amplifier (LNA) disposed between said input signal and a common signal path coupled to said first path input and said second path input.

10. The feedforward error-compensated receiver of claim 1, wherein said LNA comprises a load inductor having a secondary inductor winding configured as a source-coupled transistor pair.

11. The feedforward error-compensated receiver of claim 1, wherein said feedforward error-compensated receiver comprises a component in a frequency division duplex (FDD) receiver-transmitter.

12. The feedforward error-compensated receiver of claim 1, wherein said feedforward error-compensated receiver comprises a monolithic integrated circuit.

13. The feedforward error-compensated receiver of claim 1, wherein said monolithic integrated circuit comprises a CMOS monolithic integrated circuit.

14. The feedforward error-compensated receiver of claim 1, wherein said odd-order distortion reference generator comprises an analog RF circuit.

15. The feedforward error-compensated receiver of claim 1, wherein said feedforward error-compensated receiver comprises divide-by-two circuits situated adjacent to a LO buffer.

16. The feedforward error-compensated receiver of claim 1, wherein said odd-order nonlinear distortion reference generator is a cubic term generator.

17. The feedforward error-compensated receiver of claim 16, wherein said cubic reference generator comprises a canonical MOS squaring circuit.

18. The feedforward error-compensated receiver of claim 17, wherein a canonical MOS squaring circuit output is electrically coupled to one of two terminals of a source-coupled transistor pair.

19. The feedforward error-compensated receiver of claim 16, wherein said cubic reference generator further comprises a dummy squaring circuit whose output is electrically coupled to another one of said two terminals of said source-coupled transistor pair.

20. The feedforward error-compensated receiver of claim 16, wherein said cubic reference generator comprises a Gilbert cell multiplier configured to perform a final multiplication.

21. The feedforward error-compensated receiver of claim 5, wherein said adaptive equalizer is configured to perform a LMS-based adaptive equalization.

22. The feedforward error-compensated receiver of claim 5, wherein said adaptive equalizer is configured to perform a NLMS-based adaptive equalization.

23. The feedforward error-compensated receiver of claim 5, wherein said adaptive equalizer is configured to perform an enhanced-degree-of-freedom LMS-based or NLMS-based adaptive equalization.

24. The feedforward error-compensated receiver of claim 5, wherein said adaptive equalizer comprises a barrel shifter and said adaptive equalizer is configured to perform a log 2-quantized NLMS algorithm using said barrel shifter.

25. The feedforward error-compensated receiver of claim 1, wherein said second path is configured to be powered "ON" following detection of a nonlinear distortion signal corrupting said first receiver path.

26. The feedforward error-compensated receiver of claim 1, wherein said feedforward error-compensated receiver is configured to detect said nonlinear distortion signal corrupting said first receiver path using the analog RF portion of said at least one second receiver path.

27. The feedforward error-compensated receiver of claim 5, wherein said at least one second receiver path along with the adaptive equalizer is configured to be powered fully "ON" following detection of a nonlinear distortion signal corrupting the first signal path.

28. The feedforward error-compensated receiver of claim 1, wherein at least one second receiver path and said first path comprises a DC offset correction.

29. The feedforward error-compensated receiver of claim 1, wherein said feedforward error-compensated receiver is configured to measure said DC offset in the absence of IM3 products and wherein said feedforward error-compensated receiver is configured to subtract said DC offset.

30. The feedforward error-compensated receiver of claim 29, wherein said at least one second receiver path is configured to be powered at least in part to correct for said DC offset in the absence of IM3 products.

31. A nonlinear distortion reference generator circuit comprising:
a squaring circuit, said squaring circuit comprising a canonical squaring circuit, said squaring circuit having a squaring circuit output terminal;
a dummy squaring circuit having at least two active device control terminals and a dummy squaring circuit output terminal, said dummy squaring circuit substantially the same as said squaring circuit, said at least two active device control terminals electrically coupled to each other;
a differential source-coupled transistor pair circuit having a first and second differential source-coupled transistor pair input terminals, wherein said squaring circuit output terminal is electrically coupled to said first differential source-coupled transistor pair input terminal and said dummy squaring circuit output terminal is electrically coupled to said second differential source-coupled transistor pair input terminal.

32. The nonlinear distortion reference generator circuit of claim 31, wherein said nonlinear distortion reference generator circuit comprises a CMOS circuit.

33. The nonlinear distortion reference generator circuit of claim 31, wherein said nonlinear distortion reference generator circuit comprises a bipolar transistor-based circuit.

34. A multi-stage nonlinear distortion reference generator circuit comprising:
two or more stages of nonlinear distortion reference generator circuits electrically coupled to each other, wherein said multi-stage nonlinear distortion reference generator circuit is configured to have at least one high-pass filtering transfer function disposed between at least two of said two or more stages of nonlinear distortion reference generator circuits.

35. The multi-stage nonlinear distortion reference generator circuit of claim 34, wherein said at least one high-pass filtering transfer function comprises a frequency-dependent coupling between at least two of said two or more stages of nonlinear distortion reference generator circuits.

36. The multi-stage nonlinear distortion reference generator circuit of claim 34, wherein said at least one high-pass filtering transfer function comprises AC coupling between at least two of said two or more stages of nonlinear distortion reference generator circuits.

37. A detection circuit to detect a presence of undesired odd-order nonlinear distortion comprising:
at least one receiver path having a path input configured to receive an input signal having at least one non-baseband frequency, and a receiver path output terminal configured to provide a receiver path output signal, said receiver path comprising at least one odd-order nonlinear distortion reference generator having an output terminal, said receiver path comprising at least one mixer, each of said at least one mixer having a first input terminal electrically coupled to a local oscillator configured to provide a local oscillator signal and having a second input terminal electrically coupled to said at least one odd-order nonlinear distortion reference generator output terminal and having a mixer output terminal electrically coupled to said at least one path output, said at least one odd-order nonlinear distortion reference generator and said mixer configured to generate a synthetic odd-order nonlinear distortion signal as output, and wherein,
at least one of said at least one receiver paths is electrically coupled to at least one power detector circuit, said at least one power detector circuit configured to measure a magnitude of nonlinear distortion at, at least one of said receiver path output terminals to detect a presence of undesired odd-order nonlinear distortion.

38. The detection circuit of claim 37, wherein said detection circuit comprises a baseband filter configured to attenuate unwanted nonlinear distortion products.

39. The detection circuit of claim 37, wherein said detection circuit comprises a monolithic integrated circuit.

40. The detection circuit of claim 37, wherein said monolithic integrated circuit comprises a CMOS monolithic integrated circuit.

41. The detection circuit of claim 37, wherein said detection circuit comprises a divide-by-two circuit situated adjacent to a LO buffer.

42. The detection circuit of claim 37, wherein said odd-order nonlinear distortion reference generator comprises an analog RF circuit.

43. The detection circuit of claim 37, wherein said odd-order nonlinear distortion reference generator comprises a cubic term generator.

44. The detection circuit of claim 43, wherein said cubic reference generator comprises a canonical MOS squaring circuit.

45. The detection circuit of claim 44, further comprising a source-coupled transistor pair having a first source-coupled transistor pair input and wherein said canonical MOS squaring circuit is electrically coupled to said first source-coupled transistor pair input.

46. The detection circuit of claim 45, wherein said source-coupled transistor pair has a second source-coupled transistor pair input and said cubic reference generator further comprises a dummy squaring circuit electrically coupled to second source-coupled transistor pair input.

47. The detection circuit of claim 43, wherein said cubic reference generator comprises a Gilbert cell multiplier configured to perform a final multiplication.

48. A detection circuit to detect a presence of undesired odd-order nonlinear distortion comprising:
at least one receiver path having a path input configured to receive an input signal having at least one non-baseband frequency, and a receiver path output terminal configured to provide a receiver path output signal, said receiver path comprising at least one odd-order nonlinear distortion reference generator having an output terminal, said receiver path comprising at least one mixer, each of said at least one mixer having a first input terminal electrically coupled to a local oscillator configured to provide a local oscillator signal and having a second input terminal electrically coupled to said at least one odd-order nonlinear distortion reference generator output terminal and having a mixer output terminal electrically coupled to said at least one path output, said at least one odd-order nonlinear distortion reference generator and said mixer configured to generate a synthetic odd-order nonlinear distortion signal as output, and wherein,
at least one of said at least odd-order nonlinear distortion reference generator output terminals is electrically coupled to at least one power detector circuit, said at least one power detector circuit configured to measure a magnitude of nonlinear distortion at said odd-order nonlinear distortion reference generator output terminal to detect a presence of undesired odd-order nonlinear distortion, and wherein, at least a portion of at least one of said receiver paths is powered-down until a detection of a threshold level of said undesired odd-order nonlinear distortion is exceeded, where-upon detection of exceeding said threshold, said detection circuit causes a powering-ON of all stages of at least one receiver path to perform a cancellation of at least some undesired odd-order nonlinear distortion products.

* * * * *